United States Patent
Kang et al.

(10) Patent No.: US 12,399,398 B2
(45) Date of Patent: Aug. 26, 2025

(54) DISPLAY APPARATUS

(71) Applicant: SAMSUNG ELECTRONICS CO., LTD., Suwon-si (KR)

(72) Inventors: Ajeong Kang, Suwon-si (KR); Songhyeon Kim, Suwon-si (KR); Hansol Lee, Suwon-si (KR); Sunghee Wi, Suwon-si (KR); Dukjin Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/773,060

(22) Filed: Jul. 15, 2024

(65) Prior Publication Data

US 2025/0093702 A1    Mar. 20, 2025

Related U.S. Application Data

(63) Continuation of application No. PCT/KR2024/009067, filed on Jun. 28, 2024.

(30) Foreign Application Priority Data

Sep. 18, 2023  (KR) .................. 10-2023-0124294

(51) Int. Cl.
*G02F 1/13357* (2006.01)
*F21Y 105/14* (2016.01)
(Continued)

(52) U.S. Cl.
CPC .. *G02F 1/133608* (2013.01); *G02F 1/133603* (2013.01); *G02F 1/133612* (2021.01);
(Continued)

(58) Field of Classification Search
CPC ........ G02F 1/133603; G02F 1/133608; H05K 1/142
See application file for complete search history.

(56) References Cited

U.S. PATENT DOCUMENTS 8,305,516 B2    11/2012  Cho et al.
8,307,547 B1 *  11/2012  Cobb .................. H05K 3/0052
                                                                    29/840
(Continued)

FOREIGN PATENT DOCUMENTS

CN    103987205 B    8/2017
JP      5740144 B2    6/2015
(Continued)

OTHER PUBLICATIONS

International Search Report dated Oct. 24, 2024, issued by the International Searching Authority in International Application No. PCT/KR2024/009067.
(Continued)

*Primary Examiner* — William N Harris
(74) *Attorney, Agent, or Firm* — Sughrue Mion, PLLC

(57) ABSTRACT

A display apparatus includes: a display panel; light sources configured to emit light; a plurality of board bars on which the light sources are mounted, the plurality of board bars being spaced apart from each other along a first direction and extending in a second direction; a bottom chassis; and a plurality of bar fixers configured to fix the plurality of board bars to the bottom chassis. Each of the plurality of board bars includes: a central extending portion extending in a center of each board bar in the second direction; and a coupling portion located on the central extending portion of each of the plurality of board bars and located on one side in the first direction with respect to one light source among the light sources mounted on each of the plurality of board bars. Each of the plurality of bar fixers are disposed on each coupling portion.

19 Claims, 19 Drawing Sheets

(51) Int. Cl.
*G02F 1/1335* (2006.01)
*H05K 1/14* (2006.01)

(52) U.S. Cl.
CPC .......... *H05K 1/142* (2013.01); *F21Y 2105/14* (2016.08); *H05K 2201/09* (2013.01)

(56) References Cited

U.S. PATENT DOCUMENTS

| | | | |
|---|---|---|---|
| 9,041,303 B2 | 5/2015 | Yoon et al. | |
| 9,383,069 B2 | 7/2016 | Lankhorst et al. | |
| 9,861,003 B2 | 1/2018 | DeKeyser | |
| 10,627,091 B2* | 4/2020 | Gesell | F21V 23/006 |
| 2008/0143916 A1* | 6/2008 | Fujino | G02F 1/133603 |
| | | | 362/373 |
| 2010/0265711 A1* | 10/2010 | Lee | H05K 1/142 |
| | | | 362/249.06 |
| 2012/0086876 A1* | 4/2012 | Yokota | G02F 1/133308 |
| | | | 348/794 |
| 2012/0092562 A1 | 4/2012 | Omiya et al. | |
| 2014/0091335 A1* | 4/2014 | Satake | F21S 4/24 |
| | | | 257/88 |
| 2015/0198293 A1* | 7/2015 | Lankhorst | H05K 3/0097 |
| | | | 362/249.02 |

FOREIGN PATENT DOCUMENTS

| | | |
|---|---|---|
| JP | 6228602 B2 | 11/2017 |
| KR | 10-2010-0080024 A | 7/2010 |
| KR | 10-2013-0122415 A | 11/2013 |
| KR | 10-2014-0118440 A | 10/2014 |
| KR | 10-2016-0119979 A | 10/2016 |
| KR | 10-2016-0147229 A | 12/2016 |

OTHER PUBLICATIONS

Written Opinion dated Oct. 24, 2024, issued by the International Searching Authority in International Application No. PCT/KR2024/009067.

* cited by examiner

DISPLAY APPARATUS

CROSS-REFERENCE TO RELATED APPLICATIONS

This application is a continuation of International Application No. PCT/KR2024/009067, filed on Jun. 28, 2024, which is based on and claims priority to Korean Patent Application No. 10-2023-0124294, filed on Sep. 18, 2023, in the Korean Intellectual Property Office, the disclosures of which are incorporated by reference herein in their entireties.

BACKGROUND

1. Field

The present disclosure relates to a display apparatus.

2. Description of the Related Art

A display apparatus is a kind of an output apparatus that converts obtained or stored electrical information into visual information and displays the visual information to a user. The display apparatus may be used in various fields such as home or workplace.

The display apparatus includes a monitor apparatus connected to a personal computer or a server computer, a portable computer device, a navigation terminal device, a general television apparatus, an Internet Protocol television (IPTV), a portable terminal device, such as a smart phone, a tablet PC, a personal digital assistant (PDA) or a cellular phone. Various display apparatuses may be used to reproduce images, such as advertisements or movies in an industrial field, or various kinds of audio/video systems.

The display apparatus includes a light source module to convert electrical information into visual information, and the light source module includes a plurality of light sources to independently emit light.

Each of the plurality of light sources includes a light emitting diode (LED) or an organic light emitting diode (OLED). For example, the LED or the OLED may be mounted on a circuit board or substrate.

SUMMARY

According to an aspect of the disclosure, provided is a display apparatus including an improved structure to allow a light source board to be efficiently fixed to a bottom chassis.

According to an aspect of the disclosure, provided is a display apparatus including an improved structure to allow product durability and product performance to be increased.

According to an aspect of the disclosure, provided is a display apparatus including an improved structure to allow product manufacturing efficiency to be increased and to allow product manufacturing costs to be reduced.

According to an aspect of the disclosure, provided is a display apparatus including an improved structure to facilitate repair or replacement of components of a light source board.

According to an aspect of the disclosure, provided is a display apparatus including an improved structure to prevent a coupling portion, in which a board fixer is coupled to a light source board, from interfering with a power supply line of the light source board.

Technical problems to be achieved by the present specification are not limited to the above-mentioned technical problems, and other technical problems not mentioned will be clearly understood by those skilled in the art to which the disclosure belongs from the following description.

Additional aspects will be set forth in part in the description which follows and, in part, will be apparent from the description, or may be learned by practice of the presented embodiments.

According to an aspect of the disclosure, a display apparatus may include: a display panel; a plurality of light sources configured to emit light to the display panel; a plurality of board bars on which the plurality of light sources are mounted, the plurality of board bars being spaced apart from each other along a first direction and extending in a second direction different from the first direction; a bottom chassis configured to support the plurality of board bars; and a plurality of bar fixers configured to fix the plurality of board bars to the bottom chassis. Each of the plurality of board bars may include: a central extending portion extending in a center of each of the plurality of board bars in the second direction; and a coupling portion located on the central extending portion of each of the plurality of board bars and located on one side in the first direction with respect to one light source among the plurality of light sources mounted on each of the plurality of board bars. Each of the plurality of bar fixers may be disposed on the coupling portion of each corresponding board bar among the plurality of board bars.

The plurality of light sources mounted on each of the plurality of board bars may be spaced apart in the first direction from the central extending portion.

The plurality of light sources may include: a plurality of first side light sources disposed on one side of the first direction with respect to the central extending portion on each of the plurality of board bars; and a plurality of second side light sources disposed on another side of the first direction with respect to the central extending portion on each of the plurality of board bars. Each of the plurality of board bars may include a power supply line configured to supply power to the plurality of light sources. The power supply line may include: a first power supply line arranged along a position in which the plurality of first side light sources are arranged; and a second power supply line arranged along a position in which the plurality of second side light sources are arranged. The coupling portion may be disposed between the first power supply line and the second power supply line.

Each of the plurality of board bars may further include: a first protrusion protruding from one side of the central extending portion in the first direction, and some of the plurality of light sources being mounted on the first protrusion; and a second protrusion protruding from another side, which is opposite to the one side of the central extending portion in the first direction, and other light sources of the plurality of light sources different from the some of the light sources being mounted on the second protrusion. The coupling portion may be parallel with either an extreme end portion, which is in the first direction, of the first protrusion or an extreme end portion, which is in the first direction, of the second protrusion, with respect to the first direction.

The plurality of bar fixers may be on a rear side of the plurality of board bars facing the bottom chassis.

Each of the plurality of bar fixers may include a fixing body contacting a rear surface of the bottom chassis opposite to the plurality of board bars.

The bottom chassis may include a plurality of chassis holes configured to be penetrated by the plurality of bar fixers. The rear surface of the bottom chassis may contact the fixing body located on the rear side of the front-rear direction with respect to the plurality of chassis holes. A front surface of the bottom chassis may contact each of the plurality of board bars located on the front side with respect to the plurality of chassis holes.

The bottom chassis may further include a plurality of mounting portions, the plurality of bar fixers being mounted to the plurality of mounting portions. Each of the plurality of mounting portions may extend from a side of an edge of each of the plurality of the chassis holes toward an inside of each of the plurality of chassis holes.

Each of the plurality of bar fixers may further include an extending portion extending from the fixing body toward the plurality of board bars and is configured to penetrate the plurality of chassis holes.

The bottom chassis may include a plurality of mounting portions on which each of the plurality of bar fixers are mounted. Each of the plurality of fixing bodies and each of the plurality of extending portions may surround at least a portion of each of the plurality of mounting portions.

Each of the plurality of fixing bodies may include: a cover portion configured to cover the rear surface of the bottom chassis; and an interference protrusion protruding from the cover portion toward the rear surface of the bottom chassis and configured to interfere with the bottom chassis.

The bottom chassis may further include a plurality of mounting portions, the plurality of bar fixers being mounted to the plurality of mounting portions. Each of the plurality of coupling portions may include a board hole formed at a position corresponding to a position of the plurality of mounting portions.

The plurality of bar fixers are may be configured to be slidably mounted, in one direction, on the bottom chassis. Each of the plurality of bar fixers may include: a fixing body contacting a rear surface of the bottom chassis at a position mounted on the bottom chassis, and an inclined guide extending in the direction that is away from the rear surface of the bottom chassis as being from the fixing body to the one direction.

The display apparatus may further include: a board body supported by the bottom chassis and connected to the plurality of board bars; and a body fixer disposed on the board body and configured to fix the board body to the bottom chassis.

The body fixer may comprise a plurality of body fixers. A number of the plurality of body fixers may be less than or equal to a number of the plurality of bar fixers.

According to an aspect of the disclosure, a display apparatus may include: a display panel; a plurality of light sources configured to emit light to the display panel; a light source board on which the plurality of light sources are mounted; a bottom chassis configured to support the light source board; and a plurality of board fixers configured to fix the light source board to the bottom chassis. The light source board may include: a board body; and a plurality of board bars spaced apart from each other along a first direction and extending from the board body in a second direction different from the first direction. At least some of the plurality of board fixers may be disposed at a center of each of the plurality of board bars in the first direction and parallel to a light source among the plurality of light sources mounted on each of the board bars in the first direction, and may be configured to fix the plurality of board bars to the bottom chassis.

Each of the plurality of board fixers may include: an extending portion extending from a rear surface of the light source board facing the bottom chassis and configured to penetrate the bottom chassis; and a fixing body connected to the extending portion and contacting a rear surface of the bottom chassis opposite to the light source board.

The at least some of the plurality of board fixers may be disposed adjacent to an end of a board bar of the plurality of board bars.

Other board fixers of the plurality of board fixers, different from the at least some of the board fixers, may be disposed on the board body and configured to fix the board body to the bottom chassis.

According to an aspect of the disclosure, a display apparatus includes: a plurality of light sources; a plurality of board bars arranged in a first direction and having at least some of the plurality of light sources mounted thereon; a bottom chassis configured to support the plurality of board bars; and a plurality of bar fixers configured to fix the plurality of board bars to the bottom chassis. Each of the plurality of board bars may include: a central extending portion extending in a second direction perpendicular to the first direction; a plurality of first protrusions protruding upward in the first direction from the central extending portion; and a plurality of second protrusions protruding downward in the first direction from the central extending portion. Each of the plurality of bar fixers may be disposed at the central extending portion of each of the plurality of board bars and parallel with one of the plurality of first protrusions or the plurality of second protrusions with respect to the first direction.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
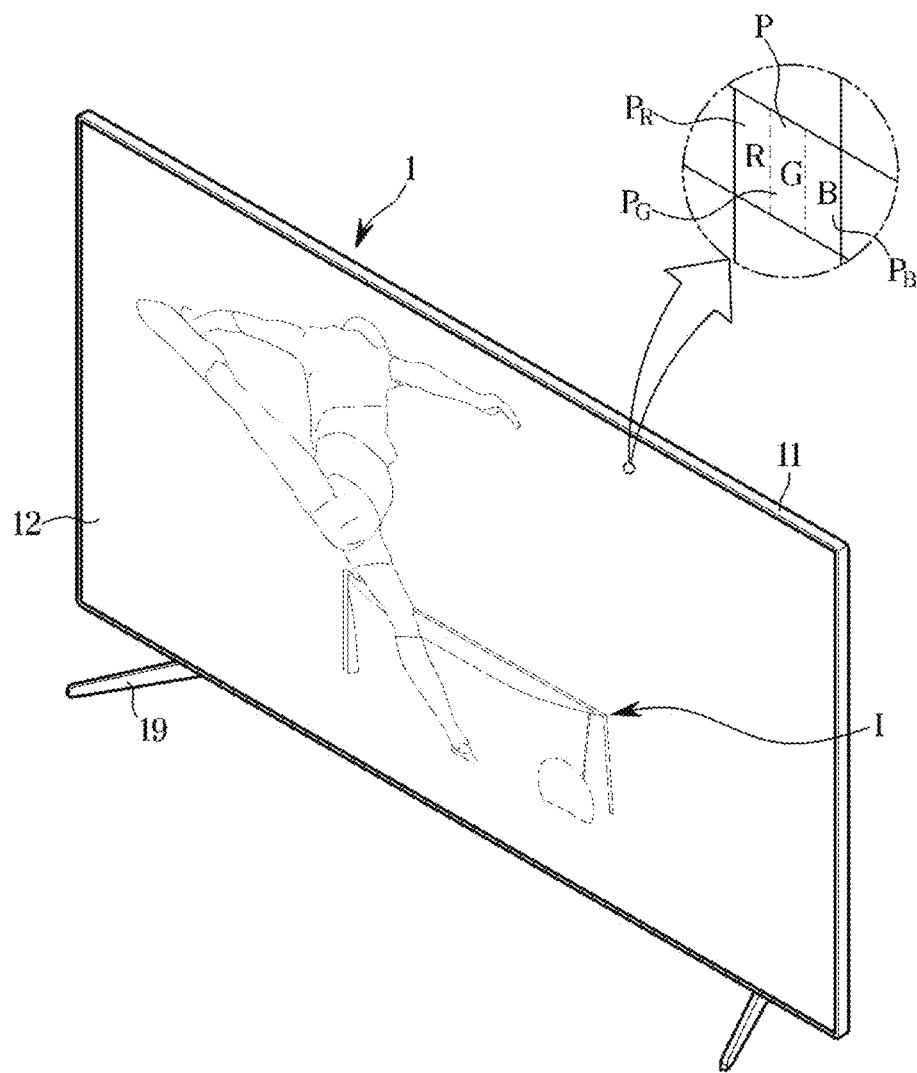
FIG. 1 is a view of a display apparatus according to one or more embodiments.
Figure 1:
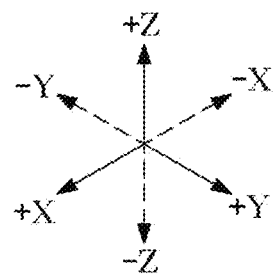

The various embodiments and the terms used therein are not intended to limit the technology disclosed herein to specific forms, and the disclosure should be understood to include various modifications, equivalents, and/or alternatives to the corresponding embodiments.

In addition, the same reference numerals or signs shown in the drawings of the disclosure indicate elements or components performing substantially the same function.

A singular expression may include a plural expression unless otherwise indicated herein or clearly contradicted by context.

The expressions "A or B," "at least one of A or/and B," or "one or more of A or/and B," "A, B or C," "at least one of A, B or/and C," or "one or more of A, B or/and C," and the like used herein may include any and all combinations of one or more of the associated listed items.

Terms such as "unit", "module", and "member" may be embodied as hardware or software. According to one or more embodiments, a plurality of "unit", "module", and "member" may be implemented as a single component or a single "unit", "module", and "member" may include a plurality of components.

Also, the terms used herein are used to describe the various embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, numbers, steps, operations, elements, components, or combinations thereof, but do not preclude the presence or addition of one or more of the features, numbers, steps, operations, elements, components, or combinations thereof.

It will be understood that, although the terms first, second, third, etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

When an element (e.g., a first element) is referred to as being "(functionally or communicatively) coupled," or "connected" to another element (e.g., a second element), the first element may be connected to the second element, directly (e.g., wired), wirelessly, or through a third element.

When an element is said to be "connected", "coupled", "supported" or "contacted" with another element, this includes not only when elements are directly connected, coupled, supported or contacted, but also when elements are indirectly connected, coupled, supported or contacted through a third element.

Throughout the description, when an element is "on" another element, this includes not only when the element is in contact with the other element, but also when there is another element between the two elements.

In the following detailed description, the terms of "up and down direction", "front and rear direction" and the like may be defined by the drawings, but the shape and the location of the element is not limited by the term. For example, the terms "front" and "rear" below may each be defined based on the X direction shown in the drawings. The terms "upward" and "downward" below may each be defined based on the Z direction shown in the drawing. The terms "left direction" and "right direction" below may be defined based on the Y direction shown in the drawing. The term "vertical direction" below may refer to the Z direction shown in the drawings, and the term "horizontal direction" below may refer to the Y direction shown in the drawings.

Hereinafter various embodiments of the present disclosure will be described in detail with reference to the accompanying drawings.

FIG. 1 is a view of a display apparatus according to one or more embodiments.

Referring to FIG. 1, a display apparatus 1 according to one or more embodiments is a device that processes an image signal received from an outside and visually displays the processed image. Hereinafter a case in which the display apparatus 1 is a television is exemplified, but the present disclosure is not limited thereto. The display apparatus 1 may be implemented in various forms, such as a monitor, a portable multimedia device, and a portable communication device, which are a type of computer output device, and the display apparatus 1 is not limited in the type thereof as long as the display apparatus is configured to visually display an image.

The display apparatus 1 may be a large format display (LFD) installed outdoors, such as a roof of a building or a bus stop. The term "outdoor" is not limited to the outside of a building, and thus the display apparatus 1 according to one or more embodiments may be installed in any places as long as the display apparatus is accessed by a large number of people, even indoors, such as subway stations, shopping malls, movie theaters, companies, and stores.

FIG. 1 illustrates a flat display apparatus with a flat screen as the display apparatus 1, but the present disclosure is not limited thereto. Therefore, the display apparatus according to the present disclosure may be applied to a curved display apparatus or a bendable or flexible display apparatus in which a flat state and a curved state are variable. Further, a configuration of the present disclosure may be applied to display apparatus of various shapes regardless of a screen size or ratio of the display apparatus.

The display apparatus 1 may receive content data including video signals and audio signals from various content sources and output video and audio corresponding to the video signals and the audio signals. According to one or more embodiments, the display apparatus 1 may receive content data through a broadcast reception antenna or cable, receive content data from a content playback device, or receive content data from a content providing server of a content provider.

The display apparatus 1 may display an image corresponding to video data and output sound corresponding to audio data. According to one or more embodiments, the display apparatus 1 may restore a plurality of image frames included in video data and continuously display the plurality of image frames. Further, the display apparatus 1 may restore an audio signal included in the audio data and continuously output sound according to the audio signal As illustrated in FIG. 1, the display apparatus 1 may include a main body 11, and a screen 12 provided to display an image I.

The display apparatus 1 may be installed on an indoor or outdoor floor or furniture in a standing manner, or may be installed on a wall or inside a wall in a wall-mounted manner. The display apparatus 1 may include a one or more support legs 19 provided in a lower portion of the main body 11 to be installed on the indoor or outdoor floor or furniture in the standing manner.

The main body 11 may form an appearance of the display apparatus 1. A component configured to allow the display apparatus 1 to display the image I and to perform various functions may be provided in the main body 11.

The display apparatus 1 may be configured to display the image I. Particularly, the screen 12 may be formed on a front surface of the main body 11, and the display apparatus 1 may display the image I on the screen 12. The screen 12 may display a still image or a moving image. Further, the screen 12 may display a two-dimensional plane image or a three-dimensional image using binocular parallax of the user.

A plurality of pixels P may be formed on the screen 12. The image I displayed on the screen 12 may be formed by a combination of the lights emitted from the plurality of pixels P. The image I may be formed on the screen 12 by combining light emitted from the plurality of pixels P as a mosaic.

Each of the plurality of pixels P may emit different brightness and different color of light. Particularly, the plurality of pixels P may include sub-pixels $P_R$, $P_G$, and $P_B$, respectively, and the sub-pixels $P_R$, $P_G$, and $P_B$ may include a red sub pixel $P_R$ emitting red light, a green sub pixel $P_G$ emitting green light, and a blue sub pixel $P_B$ emitting blue light. The red light may represent a light beam having a wavelength of approximately 620 nm (nanometers, one billionth of a meter) to 750 nm, the green light may represent a light beam having a wavelength of approximately 495 nm to 570 nm, and the blue light may represent a light beam having a wavelength of approximately 450 nm to 495 nm.

By combining the red light of the red sub pixel $P_R$, the green light of the green sub pixel $P_G$ and the blue light of the blue sub pixel $P_B$, each of the plurality of pixels P may emit different brightness and different color of light.

Figure 2:
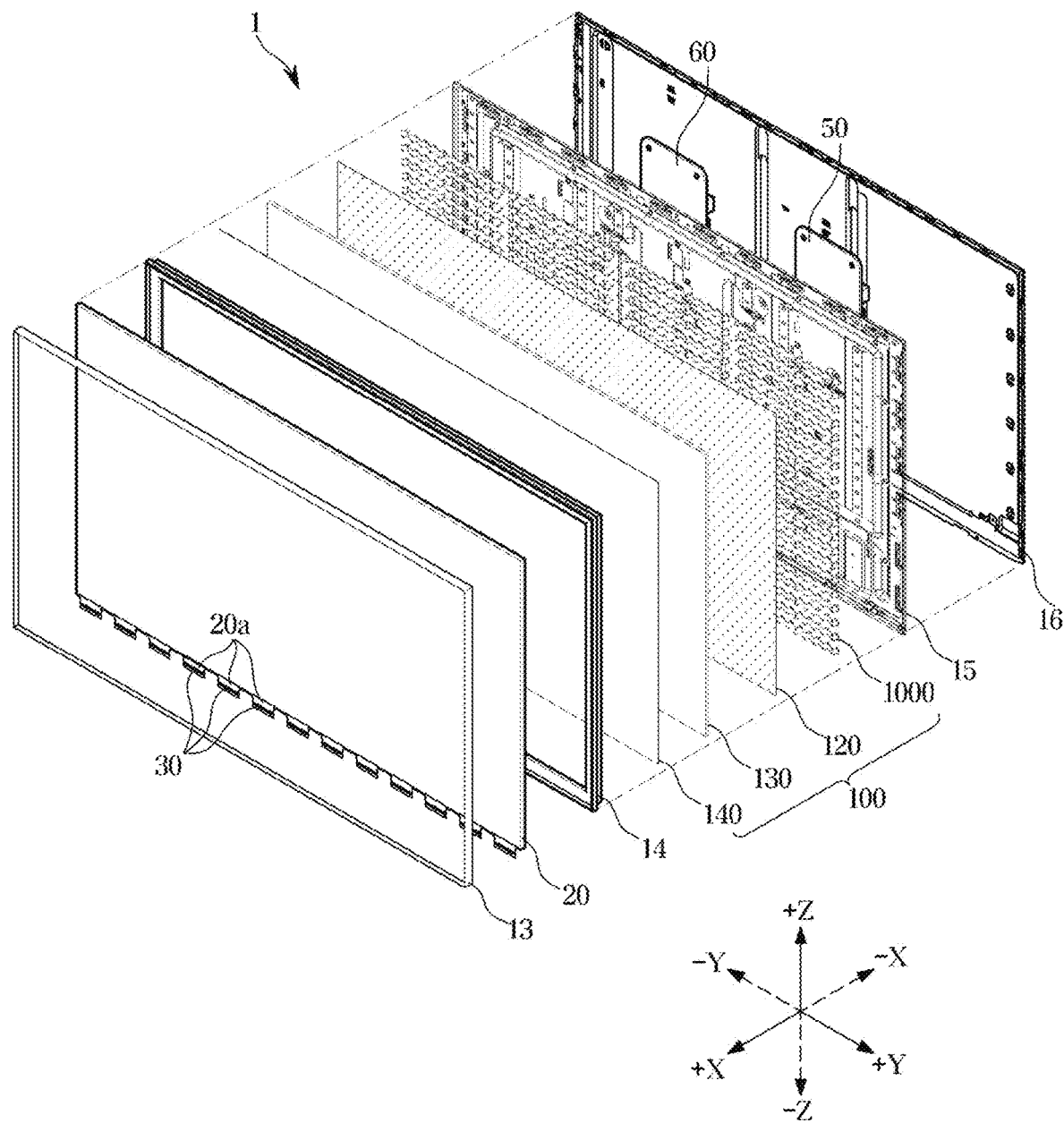
FIG. 2 is an exploded view of the display apparatus according to one or more embodiments.

FIG. 2 is an exploded view of the display apparatus according to one or more embodiments.

Referring to FIG. 2, various components for generating an image I on the screen 12 may be disposed inside the main body 11 of the display apparatus 1 according to one or more embodiments.

According to one or more embodiments, the display apparatus 1 may include a display panel 20. The display panel 20 may be disposed on the main body 11. The display panel 20 may be provided to display the image I. The screen 12 described in FIG. 1 may be formed on a front surface of the display panel 20.

According to one or more embodiments, the display panel 20 may have a substantially rectangular shape. Particularly, the display panel 20 may have a shape in which a length of the horizontal side and a length of the vertical side are different from each other. That is, the display panel 20 may be provided to have a long side and a short side. The display panel 20 may be provided in a rectangular plate shape. However, the present disclosure is not limited thereto, and the display panel 20 may be provided in the shape of a square plate in which the lengths of the long and short sides are approximately equal.

The display panel 20 may be provided in various sizes. The ratio between the long side and the short side of the display panel 20 is not limited to general cases such as 16:9 and 4:3, but may be provided at any ratio.

In the display apparatus 1 according to one or more embodiments, the display panel 20 may be composed of a non-self luminous display such as a liquid crystal display (LCD).

A cable 20a configured to transmit image data to the display panel 20, and a display driver integrated circuit (DDI) (hereinafter referred to as 'driver IC') 30 configured to process digital image data and output an analog image signal may be provided at one side of the display panel 20.

The cable 20a may electrically connect a control assembly 50 and/or a power assembly 60 to the driver IC 30, and may also electrically connect the driver IC 30 to the display panel 20. The cable 20a may include a flexible flat cable or a film cable that is bendable.

The driver IC 30 may receive image data and power from the control assembly 50 and/or the power assembly 60 through the cable 20a. The driver IC 30 may provide the image data and driving current to the display panel 20 through the cable 20a.

In addition, the cable 20a and the driver IC 30 may be integrally implemented as a film cable, a chip on film (COF), or a tape carrier package (TCP). In other words, the driver IC 30 may be arranged on the cable 20b. However, the present disclosure is not limited thereto, and the driver IC 30 may be arranged on the display panel 20.

A structure of the display panel 20 will be described later.

The display apparatus 1 may include a backlight unit 100 configured to emit light toward the display panel 20. The backlight unit 100 may be disposed in the main body 11. The backlight unit 100 may be arranged at the rear of the display panel 20 to emit light toward the front where the display panel 20 is located. Particularly, the backlight unit 100 may be provided as a surface light source. The display panel 20 may block or pass light emitted from the backlight unit 100.

The backlight unit 100 may include a point light source configured to emit monochromatic light or white light. The backlight unit 100 may refract, reflect, and scatter light in order to convert light, which is emitted from the point light source, into uniform surface light. The backlight unit 100 may refract, reflect, and scatter light emitted from the point light source, thereby emitting uniform surface light toward the front side.

As illustrated in FIG. 2, the backlight unit 100 may include a light source module 1000. The light source module 1000 may generate and emit light. Particularly, the light source module 1000 may be configured to emit monochromatic light or white light.

Figure 4:
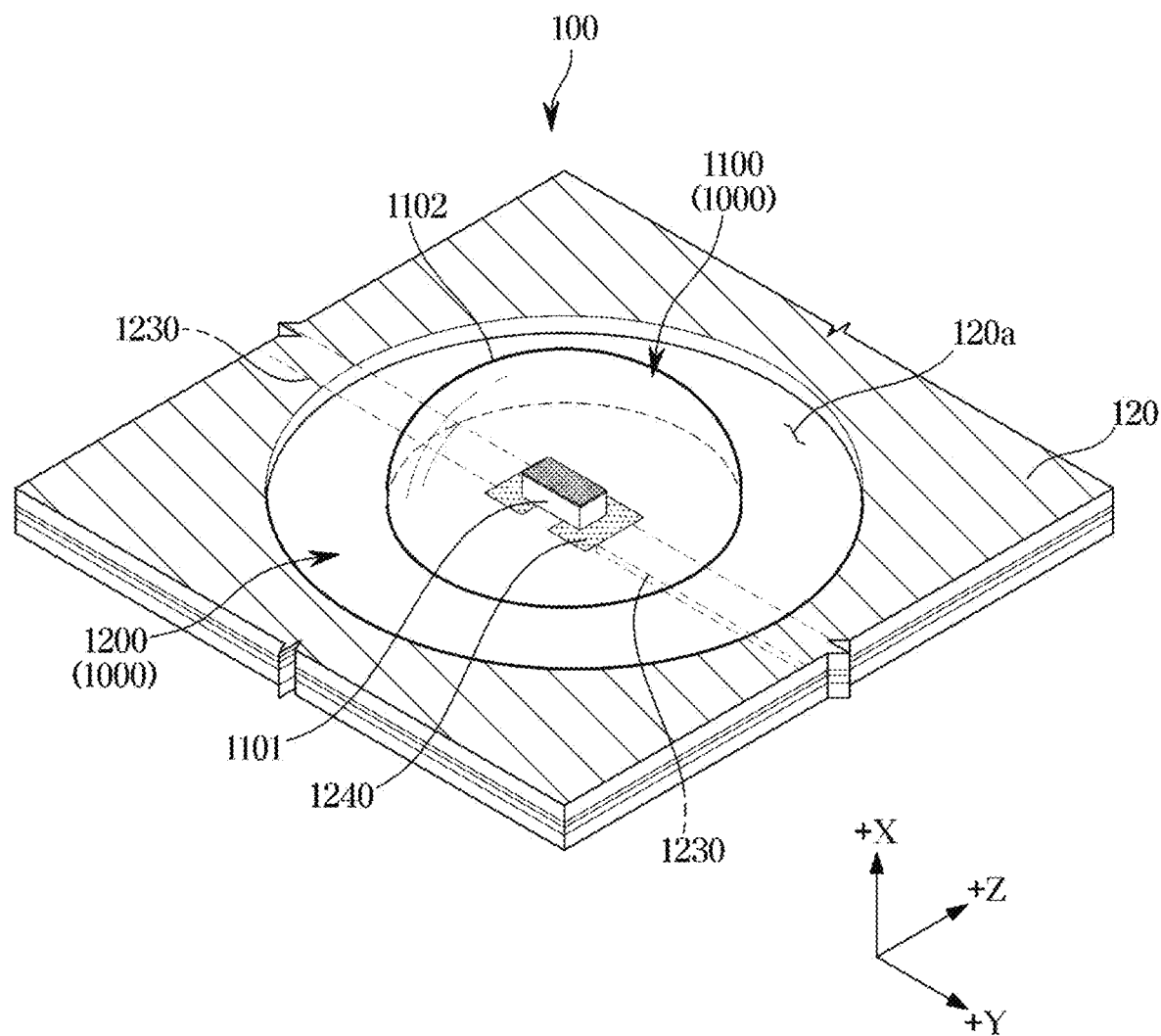
FIG. 4 is an enlarged view of a light source and a reflective sheet of the display apparatus according to one or more embodiments.

The light source module 1000 may include a plurality of light sources 1100 configured to emit light, and a light source board 1200 on which the plurality of light sources 1100 is mounted (refer to FIG. 4, etc.).

The light source module 1000 will be described later.

As illustrated in FIG. 2, the backlight unit 100 may include a reflective sheet 120 provided to reflect light. The reflective sheet 120 may reflect light forward or in a direction close to the front.

According to one or more embodiments, the reflective sheet 120 may be attached to a front surface of the light source module 1000. Particularly, the reflective sheet 120 may be attached to a front surface of the light source board 1200.

According to one or more embodiments, in front of the reflective sheet 120, the light source module 1000 (particularly, the light source 1100 of the light source module 1000, refer to FIG. 4) may emit light in various directions. The light emitted from the light source module 1000 may not only be emitted toward a diffuser plate 130, which will be described later, but may also be emitted from the light source module 1000 toward the reflective sheet 120.

The reflective sheet 120 may reflect the light, which is emitted toward the reflective sheet 120, toward the diffuser plate 130.

Further, while the light emitted from the light source module 1000 passes through various objects such as the diffuser plate 130 and an optical sheet 140, a portion of the light may be reflected from a surface of the diffuser plate 130 and the optical sheet 140. The reflective sheet 120 may reflect the light, which is reflected by the above-mentioned reason, forward again.

As illustrated in FIG. 2, the backlight unit 100 may include the diffuser plate 130 provided to uniformly diffuse light. The diffuser plate 130 may be provided in front of the light source module 1000 and the reflective sheet 120. The diffuser plate 130 may evenly disperse the light emitted from the light source module 1000 and then emit the light forward.

As illustrated in FIG. 2, the backlight unit 100 may include the optical sheet 140 provided to further improve the luminance and uniformity of the emitted light. The optical sheet 140 may be provided to refract and scatter light emitted from the front of the diffuser plate 130. According to one or more embodiments, the optical sheet 140 may include various types of sheets, such as a diffusion sheet, a prism sheet, a reflective polarizing sheet, and a quantum dot sheet.

The display apparatus 1 may include the control assembly 50 configured to control the operation of the backlight unit 100 and the display panel 20, and the power assembly 60 configured to supply power to the backlight unit 100 and the display panel 20. The control assembly 50 and the power assembly 60 may be disposed in the main body 11.

According to one or more embodiments, the control assembly 50 may include a control circuit configured to control an operation of the display panel 20 and the backlight unit 100. The control circuit may process image data received from an external content source, transmit image data to the display panel 20, and transmit dimming data to the backlight unit 100.

According to one or more embodiments, the power assembly 60 may include a power circuit configured to supply power to the display panel 20 and the backlight unit 100 so as to allow the backlight unit 100 to emit surface light and to allow the display panel 30 to block or pass the light emitted from the backlight unit 100.

The control assembly 50 and the power assembly 60 may be implemented as a printed circuit board and various circuits mounted on the printed circuit board. According to one or more embodiments, the power circuit may include a capacitor, a coil, a resistance element, a processor, and a power circuit board on which the capacitor, the coil, the resistance element, and the processor are mounted. Further, the control circuit may include a memory, a processor, and a control circuit board on which the memory and the processor are mounted.

The display apparatus 1 may include a display case provided to support various components of the main body 11 of the display apparatus 1. In other words, various components of the main body 11 may be accommodated inside the display case. The display case may form the external appearance of the display apparatus 1.

According to one or more embodiments, the display case may support the display panel 20. According to one or more embodiments, the display case may support the backlight unit 100. According to one or more embodiments, the display case may support the control assembly 50. According to one or more embodiments, the display case may support the power assembly 60.

According to one or more embodiments, the display apparatus 1 may include a top chassis 13. The top chassis 13 may include a top chassis 13 provided to support a front surface or side surfaces of the display panel 20. According to one or more embodiments, the top chassis 13 may be provided in a substantially quadrangle frame shape.

The top chassis 13 may support the front surface of the display panel 20 by forming a bezel that is disposed to face in the front of the display apparatus 1. However, when the display apparatus 1 is a bezel-less type display apparatus with a very narrow or no bezel, the top chassis 13 may be provided to support only the side surface of the display panel 20. Alternatively, when the bottom chassis 15 supports the side surface of the display panel 20, the display apparatus 1 may not include the top chassis 13.

According to one or more embodiments, the display apparatus 1 may include the bottom chassis 15. The bottom chassis 15 may cover the rear of the display panel 20. The bottom chassis 15 may be coupled to the rear of the top chassis 13. The bottom chassis 15 may support various components of the display apparatus 1, such as the backlight unit 100, the control assembly 50, and the power assembly 60.

The bottom chassis 15 may be formed to have a substantially flat plate shape, but is not limited thereto. The bottom chassis 15 may be formed of a material with high thermal conductivity to dissipate heat generated from the light source to the outside. According to one or more embodiments, the bottom chassis 15 may be formed of a metal material such as aluminum or SUS, or a plastic material such as ABS.

According to one or more embodiments, the display apparatus 1 may include a middle mold 14. The middle mold 14 may be disposed between the top chassis 13 and the bottom chassis 15. According to one or more embodiments, the middle mold 14 may support at least some components of the backlight unit 100.

According to one or more embodiments, the display apparatus 1 may include a rear cover 16. The rear cover 16 may be disposed at the rear of the bottom chassis 15 and provided to cover the bottom chassis 15 and various components mounted on the rear of the bottom chassis 15 (such as the control assembly 50, the power assembly 60, etc.).

Meanwhile, unlike FIG. 2, the display case of the display apparatus 1 according to one or more embodiments may not include some of the top chassis, the middle mold, the bottom chassis, and the rear cover.

The configuration of the display apparatus 1 described above with reference to FIG. 2 is only an example of the one or more embodiments for describing the display apparatus according to the present disclosure, and the present disclosure is not limited thereto. The display apparatus according to the present disclosure may be provided to include various configurations to perform the function of providing images through a screen.

Figure 3:
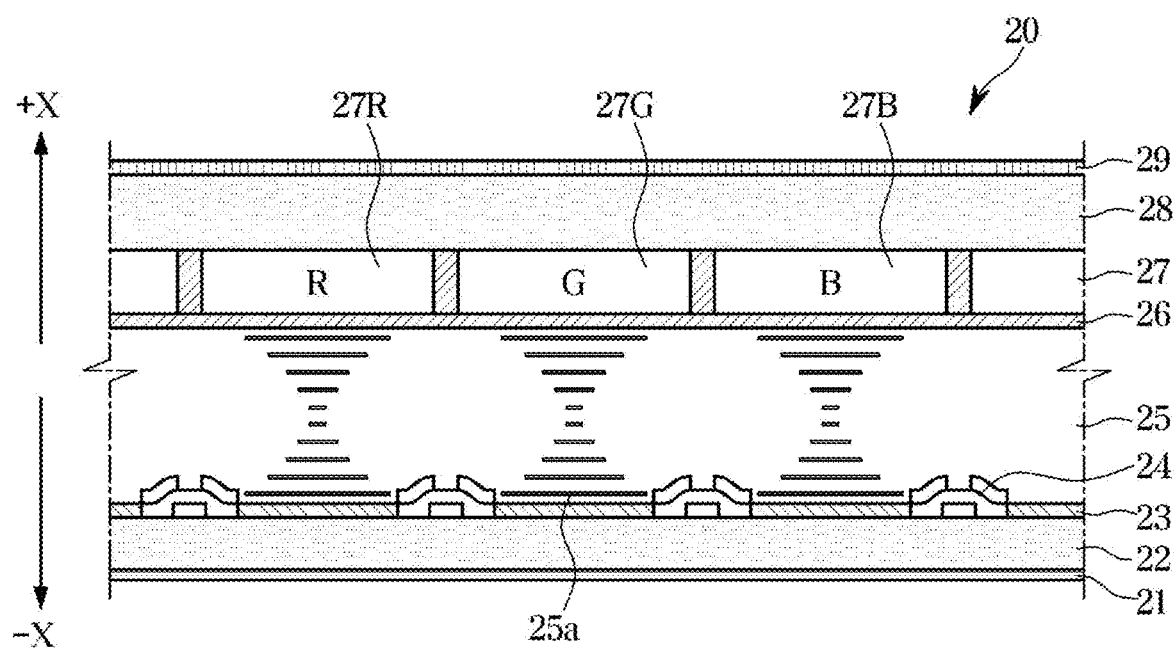
FIG. 3 is a cross-sectional view of a liquid crystal panel of the display apparatus according to one or more embodiments.

FIG. 3 is a cross-sectional view of a liquid crystal panel of the display apparatus according to one or more embodiments.

Referring to FIG. 3, the display panel 20 included in the display apparatus 1 according to one or more embodiments may be composed of a liquid crystal display (LCD) panel, and configured to block or transmit light emitted from the backlight unit 100. The image I may be formed in front of the display panel 20 by an operation in which the display panel 20 blocks or transmits the light emitted from the backlight unit 100.

The front surface of the display panel 20 may form the screen 12 of the display apparatus 1 described above, and the plurality of pixels P may be provided in the display panel 20. In the display panel 20, the plurality of pixels P may independently block or transmit light of the backlight unit 100, and the light transmitted through the plurality of pixels P may form the image I displayed on the screen 12.

According to one or more embodiments, as shown in FIG. 3, the display panel 20 may include a first polarizing film 21, a first transparent substrate 22, a pixel electrode 23, a thin film transistor 24, a liquid crystal layer 25, a common electrode 26, a color filter 27, a second transparent substrate 28, and a second polarizing film 29.

The first transparent substrate 22 and the second transparent substrate 28 may fixedly support the pixel electrode 23, the thin film transistor 24, the liquid crystal layer 25, the common electrode 26, and the color filter 27. The first and second transparent substrates 22 and 28 may be formed of tempered glass or transparent resin.

The first polarizing film 21 and the second polarizing film 29 may be provided on the outside of the first and second transparent substrates 22 and 28.

Each of the first polarizing film 21 and the second polarizing film 29 may transmit a specific light beam and block other light beams. According to one or more embodiments, the first polarizing film 21 may transmit a light beam having a magnetic field vibrating in a first direction and block other light beams. In addition, the second polarizing film 29 may transmit a light beam having a magnetic field vibrating in a second direction and block other light beams. In this case, the first direction and the second direction may be perpendicular to each other. Accordingly, a polarization direction of the light transmitted through the first polarizing film 21 and a vibration direction of the light transmitted through the second polarizing film 29 may be perpendicular to each other. As a result, generally, light may not pass through the first polarizing film 21 and the second polarizing film 29 at the same time.

The color filter 27 may be provided on an inner side of the second transparent substrate 28.

The color filter 27 may include a red filter 27R transmitting red light, a green filter 27G transmitting green light, and a blue filter 27B transmitting blue light. The red filter 27R, the green filter 27G, and the blue filter 27B may be disposed in parallel with each other. A region, in which the color filter 27 is formed, may correspond to the pixel P described above. A region, in which the red filter 27R is formed, may correspond to the red sub-pixel $P_R$, a region, in which the green filter 27G is formed, may correspond to the green sub-pixel $P_G$, and a region, in which the blue filter 27B is formed, may correspond to the blue sub-pixel $P_B$.

The pixel electrode 23 may be provided on an inner side of the first transparent substrate 22, and the common electrode 26 may be provided on an inner side of the second transparent substrate 28.

The pixel electrode 23 and the common electrode 26 may be formed of a metal material through which electricity is conducted, and the pixel electrode 23 and the common electrode 26 may generate an electric field to change the arrangement of liquid crystal molecules 25a forming the liquid crystal layer 25 to be described below.

The pixel electrode 23 and the common electrode 26 may be formed of a transparent material, and may transmit light incident from the outside. According to one or more embodiments, the pixel electrode 23 and the common electrode 26 may include indium tin oxide (ITO), indium zinc oxide (IZO), silver nanowire (Ag nano wire), carbon nanotube (CNT), graphene, or poly (3,4-ethylenedioxythiophene) (PEDOT). The thin film transistor (TFT) 24 may be provided in an inner side of the second transparent substrate 28.

The TFT 24 may transmit or block a current flowing through the pixel electrode 23. According to one or more embodiments, an electric field may be formed or removed between the pixel electrode 23 and the common electrode 26 in response to turning on (closing) or turning off (opening) the TFT 24.

The TFT 24 may be formed of poly-silicon, and may be formed by semiconductor processes, such as lithography, deposition, and ion implantation.

The liquid crystal layer 25 may be formed between the pixel electrode 23 and the common electrode 26, and the liquid crystal layer 25 may be filled with the liquid crystal molecules 25a.

Liquid crystals represent an intermediate state between a solid (crystal) and a liquid. Most of the liquid crystal materials are organic compounds, and the molecular shape is in the shape of an elongated rod, and the orientation of molecules is in an irregular state in one direction, but in a regular state in other directions. As a result, the liquid crystal has both the fluidity of the liquid and the optical anisotropy of the crystal (solid).

In addition, liquid crystals also exhibit optical properties according to changes in an electric field. In the liquid crystal, the orientation of molecules forming the liquid crystal may change according to a change in an electric field. When an electric field is generated in the liquid crystal layer 25, the liquid crystal molecules 25a of the liquid crystal layer 25 may be disposed along the direction of the electric field. When the electric field is generated in the liquid crystal layer 25, the liquid crystal molecules 25a may be disposed irregularly or disposed along an alignment layer. As a result, the optical properties of the liquid crystal layer 25 may vary depending on the presence or absence of the electric field passing through the liquid crystal layer 25.

The structure of the display panel 20 described above with reference to FIG. 3 is only an example of a structure of the display panel of the display apparatus according to the one or more embodiments of the present disclosure, and the present disclosure is not limited thereto.

FIG. 4 is an enlarged view of a light source and a reflective sheet of the display apparatus according to one or more embodiments.

Referring to FIG. 4, the display apparatus 1 according to one embodiment of the present disclosure may include the plurality of light sources 1100 and the light source board 1200 on which the light sources 1100 are mounted. The plurality of light sources 1100 and the light source board 1200 may form the light source module 1000 of the backlight unit 100.

FIG. 4 illustrates one light source 1100 among the plurality of light sources 1100 included in the light source module 1000, and a description of a structure and function of the light source 1100 described below with reference to FIG. 4 may be commonly applied to each of the plurality of light sources 1100.

The light source 1100 may be configured to emit light. The light source 1100 may be configured to emit light toward the display panel 20. The light source 1100 may employ an element configured to emit monochromatic light (light of a specific wavelength, e.g., blue light) or white light (e.g., light of a mixture of red light, green light, and blue light) in various directions by receiving power. The light source 111 may include a light emitting diode (LED).

The light source board 1200 may fix the plurality of light sources 1100 to prevent a change in the position of the light source 1100. Further, the light source board 1200 may supply power, which is for the light source 1100 to emit light, to the light source 1100.

The light source board 1200 may fix the plurality of light sources 1100 and may be configured with synthetic resin or tempered glass or a printed circuit board (PCB) on which a conductive power supply line for supplying power to the light source 1100 is formed.

The light source 1100 may be disposed on the front surface of the light source board 1200. The front surface of the light source board 1200 may refer to one surface of the light source board 1200 facing the display panel 20. That is, the light source 1100 may be mounted on the light source board 1200 to face forward and emit light forward.

The reflective sheet 120 may be disposed in front of the light source board 1200. As described above, the reflective sheet 120 may be coupled to the front surface of the light source board 1200. At this time, the reflective sheet 120 may include a plurality of through holes 120a formed at positions corresponding to each of the plurality of light sources 1100 of the light source module 1000. As shown in FIG. 4, the light source 1100 may pass through the through hole 120a and protrude toward the front of the reflective sheet 120. As a result, the light source 1100 and a portion of the light source board 1200 may be exposed toward the front of the reflective sheet 120 through the through hole 120a. With this configuration, the light source 1100 may emit light in front of the reflective sheet 120.

The reflective sheet 120 may reflect light, which is emitted from the light source 1100 toward the reflective sheet 120, toward the diffuser plate 130.

A process, in which the light emitted from the plurality of light sources 1100 or the light reflected by the reflective sheet 120 travels toward the display panel 20, is as described above.

Hereinafter a structure of the light source 1100 and the light source board 1200 will be described.

The light source 1100 may include a light emitting diode 1101. The light emitting diode 1101 may include a P-type semiconductor and an N-type semiconductor for emitting light by recombination of holes and electrons. In addition, the light emitting diode 1101 may be provided with a pair of electrodes for supplying hole and electrons to the P-type semiconductor and the N-type semiconductor, respectively.

The light emitting diode 1101 may be configured to convert electrical energy into optical energy. In other words, the light emitting diode 1101 may emit light having a maximum intensity at a predetermined wavelength based on the supplied power. According to one or more embodiments, the light emitting diode 1101 may emit blue light having a peak value at a wavelength indicating blue color (e.g., a wavelength between 430 nm and 495 nm).

According to one or more embodiments, a multilayer reflective structure, in which a plurality of insulation layers having different refractive indices is alternately laminated, may be provided on the front surface of the light emitting diode 1101. The multilayer reflective structure may be provided with a Distributed Bragg Reflector (DBR).

According to one or more embodiments, the light emitting diode 1101 may be directly attached to the light source board 1200 in a Chip On Board (COB) method. In other words, the light source 1100 may include the light emitting diode 1101 to which a light emitting diode chip or a light emitting diode die is directly attached to the light source board 1200 without an additional packaging.

The light source module 1000 may be manufactured in such a way that the flip-chip type light emitting diode 1101 is attached to the light source board 1200 in a chip-on-board method. Accordingly, it is possible to reduce the size of the light source 1100.

The light source board 1200 may include a power supply line 1230 provided to supply power to the light source 1100. The power supply line 1230 may be provided to supply an electrical signal and/or power from the control assembly 50 and/or the power assembly 60 to the light source 1100. According to one or more embodiments, the power supply line 1230 may be provided to supply power to the flip chip type light emitting diode 1101.

According to one or more embodiments, the light source board 1200 may be formed by alternately laminating an insulation layer that is non-conductive and a conduction layer that is conductive.

A line or pattern, through which power and/or electrical signals pass, may be formed on the conduction layer. The conduction layer may be formed of various materials having an electrical conductivity. For example, the conduction layer may be formed of various metal materials, such as copper (Cu), tin (Sn), aluminum (Al), or an alloy thereof. The power supply line 1230 may be implemented by the line or pattern formed on the conduction layer of the light source board 1200.

A dielectric of the insulation layer of the light source board 1200 may insulate between lines or patterns of the conduction layer. The insulation layer may be formed of a dielectric for electrical insulation, such as a multipurpose glass epoxy laminate that features flame-retardant properties (FR-4).

According to one or more embodiments, a protection layer configured to prevent or suppress damages caused by an external impact and/or damages caused by a chemical action (e.g., corrosion, etc.) and/or damages caused by an optical action, to the light source board 1200 may be formed on an outer surface of the light source board 1200. According to one or more embodiments, the protection layer of the light source board 1200 may include a photo solder resist (PSR).

The power supply line 1230 may be covered by the protection layer of the light source board 1200, so as to be prevented from being exposed to the outside.

According to one or more embodiments, the light source board 1200 may include a power supply pad 1240 provided to be electrically connected to the power supply line 1230 to supply power to the flip chip type light emitting diode 1101. The power supply line 1230 may be electrically connected to the light emitting diode 1101 through the power supply pad 1240.

According to one or more embodiments, a window may be formed in the protection layer of the light source board 1200 to expose a portion of the power supply line 1230 to the outside. The power supply pad 1240 may be electrically connected to a portion of the power supply line 1230 exposed to the outside of the light source board 1200.

According to one or more embodiments, various electrically conductive adhesive materials such as solder and electrically conductive epoxy adhesives may be applied between the electrode of the light emitting diode 1101 and the power supply pad 1240.

The light source 1100 may include an optical dome 1102. The optical dome 1102 may cover the light emitting diode 1101. The optical dome 1102 may prevent or suppress damages to the light emitting diode 1101 caused by an external mechanical action and/or damage to the light emitting diode 1101 caused by a chemical action.

The optical dome 1102 may have a dome shape formed in such a way that a sphere is cut into a surface not including the center thereof, or may have a hemispherical shape in such a way that a sphere is cut into a surface including the center thereof. A vertical cross section of the optical dome 1102 may be a bow shape or a semicircle shape.

The optical dome 1102 may be formed of silicone or epoxy resin. According to one or more embodiments, the molten silicon or epoxy resin may be discharged onto the light emitting diode 1101 through a nozzle, and the discharged silicon or epoxy resin may be cured, thereby forming the optical dome 1102.

The optical dome 1102 may be optically transparent or translucent. Light emitted from the light emitting diode 1101 may be emitted to the outside by passing through the optical dome 1102.

In this case, the dome-shaped optical dome 1102 may refract light like a lens. According to one or more embodiments, light emitted from the light emitting diode 1101 may be refracted by the optical dome 1102 and thus may be dispersed.

The structure of the light source module 1000 such as the light source 1100 and the light source board 1200 described with reference to FIG. 4 is only an example of the structure of the light source module of the display apparatus according to one or more embodiments of the present disclosure and the present disclosure is not limited thereto.

Figure 5:
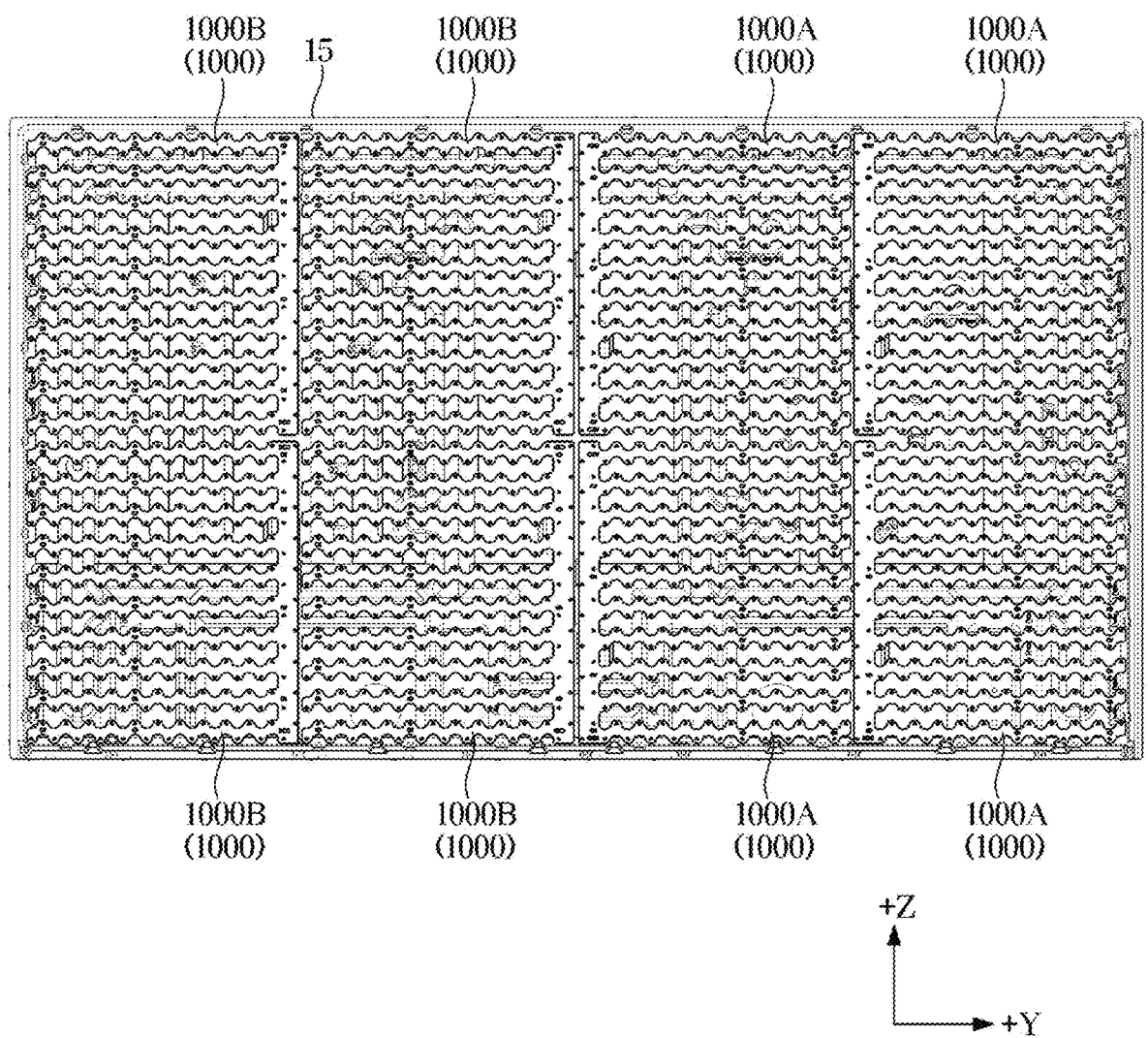
FIG. 5 is a view illustrating a light source board and a bottom chassis of the display apparatus according to one or more embodiments.

FIG. 5 is a diagram illustrating a light source board and a bottom chassis of the display apparatus according to one or more embodiments.

Referring to FIG. 5, the display apparatus 1 according to one or more embodiments may include a plurality of light source modules 1000.

The plurality of light source modules 1000 may be disposed in front of the bottom chassis 15 (+X direction). According to one or more embodiments, the plurality of light source modules 1000 may each be mounted on the bottom chassis 15. That is, the plurality of light source modules 1000 may each be fixed to the bottom chassis 15 and supported by the bottom chassis 15.

Particularly, the plurality of light source modules 1000 may be fixed to the bottom chassis 15 as each light source board 1200 is fixed to the bottom chassis 15. A detailed description of the structure to allow the light source board 1200 to be fixed to the bottom chassis 15 will be described later.

According to one or more embodiments, the plurality of light source modules 1000 may be formed in shapes that correspond to each other. In other words, each of the plurality of light source modules 1000 may have substantially the same structure.

According to one or more embodiments, as shown in FIG. 5, a light source module 1000A located on the right side (+Y direction side) of the display apparatus 1 among the plurality of light source modules 1000 and a light source module 1000B located on the left side (−Y direction side) of the display apparatus 1 among the plurality of light source modules 1000 may arranged to allow the vertical and horizontal directions to be opposite to each other (i.e., rotated by 180 degrees about the X axis). According to this arrangement, the plurality of light source modules 1000 may be arranged to be left and right symmetrical with respect to the horizontal center of the display apparatus 1, and provided to allow both sides of luminance to be uniform with respect to the horizontal center of the display apparatus 1.

As the plurality of light source modules 1000 is designed to have almost the same shape as each other, waste of components may be prevented and efficiency of the manufacturing process may be improved, thereby reducing manufacturing cost.

However, the present disclosure is not limited thereto, and at least some of the plurality of light source modules 1000 may be formed to have different shapes.

FIG. 5 illustrates an one or more embodiments in which the display apparatus 1 includes eight light source modules 1000, but the number of light source modules 1000 included in the display apparatus 1 is not limited to that shown in FIG. 5. According to one or more embodiments, the number of light source modules 1000 included in the display apparatus 1 may be more or less than the number shown in FIG. 5. Alternatively, the display apparatus 1 may include a single light source module 1000 that is integrally formed.

Hereinafter the structure of one light source module 1000 among the plurality of light source modules 1000 will be described particularly. According to one or more embodiments, the structure of one light source module 1000 described below may be applied to each of the plurality of light source modules 1000.

Figure 6:
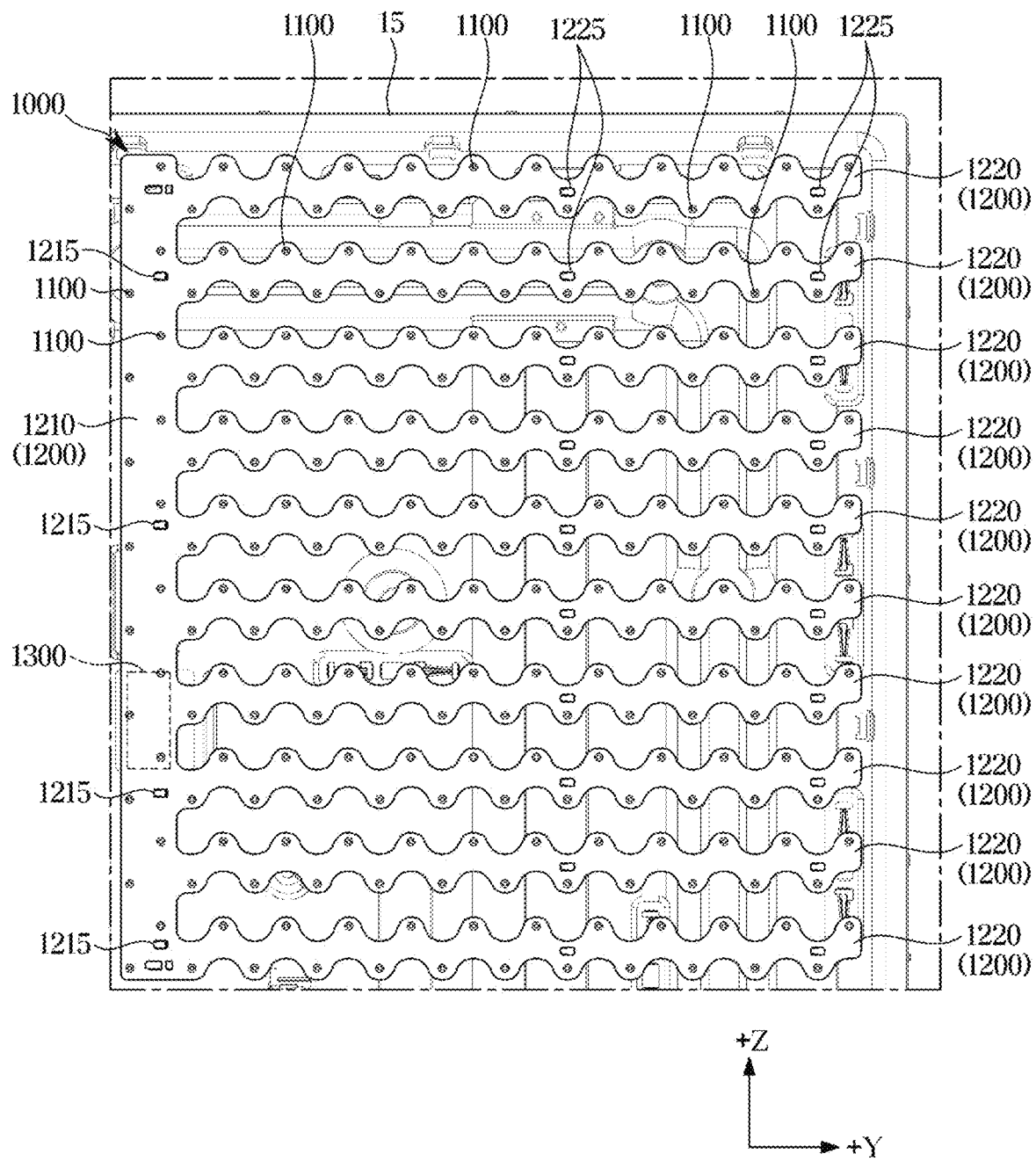
FIG. 6 is an enlarged view of a portion of the light source board and the bottom chassis of the display apparatus according to one or more embodiments.

FIG. 6 is an enlarged view of a portion of the light source board and the bottom chassis of the display apparatus according to one or more embodiments.

Referring to FIG. 6, the light source module 1000 of the display apparatus 1 according to one or more embodiments may include a plurality of board bars 1220.

The board bar 1220 may be a configuration forming at least a portion of the light source board 1200 described above and may be a configuration including a printed circuit board extending in one direction.

At least some of the plurality of light sources 1100 may be mounted on the plurality of board bars 1220, respectively. At least some of the plurality of light sources 1100 may be mounted on a front surface of the plurality of board bars 1220. The front surface of the plurality of board bars 1220 refers to one surface of the plurality of board bars 1220 in the direction in which the plurality of board bars 1220 faces the display panel 20.

The plurality of board bars 1220 may be composed of a printed circuit board on which the light source 1100 is mounted and the above-described power supply line 1230, etc. are provided.

The plurality of board bars 1220 may be arranged to be spaced apart from each other. The plurality of board bars 1220 may be arranged to be spaced apart from each other along the first direction Z. The first direction Z in which the plurality of board bars 1220 is spaced apart from each other may be substantially parallel to the vertical direction (i.e., up and down direction) of the display apparatus 1. The plurality of board bars 1220 may be arranged side by side at positions spaced apart from each other.

Each of the plurality of board bars 1220 may be formed to have a substantially bar shape. Particularly, each of the plurality of board bars 1220 may have a width in the first direction Z and may be elongated in a second direction Y different from the first direction Z. That is, each of the plurality of board bars 1220 may have a shape in which a length in the second direction Y is greater than the width in the first direction Z.

According to one or more embodiments, a width direction of each of the plurality of board bars 1220 may be substantially parallel to the vertical direction (i.e., up and down direction) of the display apparatus 1. According to one or more embodiments, a direction in which each of the plurality of board bars 1220 extends may be substantially parallel to the horizontal direction (i.e., left and right direction) of the display apparatus 1.

According to one or more embodiments, the direction in which each of the plurality of board bars 1220 extends may be parallel to the long side direction of the display apparatus 1. According to one or more embodiments, the width direction of each of the plurality of board bars 1220 may be parallel to the short side direction of the display apparatus 1.

According to one or more embodiments, the direction in which the plurality of board bars 1220 is spaced apart from each other may be parallel to each width direction. In other words, the plurality of board bars 1220 may be arranged to be spaced apart from each other along the first direction Z, which is each width direction.

Each of the plurality of board bars 1220 may extend in a direction different from the direction in which the plurality of board bars 1220 is spaced apart from each other. Particularly, each of the plurality of board bars 1220 may extend in a direction (Y direction) perpendicular to the direction in which the plurality of board bars 1220 is spaced apart from each other (Z direction). That is, the above-described first and second directions may be perpendicular to each other.

Alternatively, the direction in which the plurality of board bars 1220 is arranged to be spaced apart from each other and the direction in which each of the plurality of board bars 1220 extends may have a predetermined angle, but the angle may not be exactly vertical.

According to one or more embodiments, the plurality of board bars 1220 may be arranged to allow a distance between the plurality of board bars 1220 in the first direction Z to be uniform. In other words, the distance in the first direction Z between a pair of adjacent board bars 1220 among the plurality of board bars 1220 may be approximately the same. Accordingly, the uniformity of luminance of the display apparatus 1 may be improved.

According to one or more embodiments, the plurality of board bars 1220 may be formed to have shapes that correspond to each other. According to one or more embodiments, the widths of the plurality of board bars 1220 in the first direction (Z direction) may correspond to each other.

According to one or more embodiments, the lengths of the plurality of board bars 1220 extending in the second direction (Y direction) may correspond to each other. According to one or more embodiments, the plurality of board bars 1220 may be formed in sizes corresponding to each other.

The reflective sheet 120 may be attached to the front surface of each of the plurality of board bars 1220.

Each of the plurality of board bars 1220 may be mounted on the bottom chassis 15. As each of the plurality of board bars 1220 is mounted on the bottom chassis 15 and maintains a fixed position, the plurality of light sources 1100 mounted on the plurality of board bars 1220 may be stably disposed at each designed position.

A structure configured to allow each of the plurality of board bars 1220 to be fixed to the bottom chassis 15 will be described later.

The light source module 1000 of the display apparatus 1 may include a board body 1210. The board body 1210 may be a configuration forming at least a portion of the light source board 1200 described above and may be a configuration including a printed circuit board.

The plurality of board bars 1220 may be connected to the board body 1210. The plurality of board bars 1220 may be supported by the board body 1210. According to one or more embodiments, the plurality of board bars 1220 may be connected to one side of the board body 1210.

The plurality of board bars 1220 may extend from the board body 1210. According to one or more embodiments, each of the plurality of board bars 1220 may extend from the board body 1210 in the second direction Y. According to one or more embodiments, each of the plurality of board bars 1220 may extend from one side of the board body 1210 in the second direction Y.

According to one or more embodiments, the board body 1210 may extend along the first direction Z. According to one or more embodiments, the board body 1210 may have a shape in which a length in the first direction Z is greater than a width in the second direction Y. In this case, as the board body 1210 extends along the direction in which the plurality of board bars 1220 is arranged, the board body 1210 may have a structure in which a greater number of board bars 1220 are connected. Further, in this case, as the plurality of board bars 1220 extends from one side, which is in the second direction Y corresponding to the width direction (i.e., the relatively short direction), of the board body 1210, the plurality of board bars 1220 may have a shape that is extends longer.

According to one or more embodiments, some of the plurality of light sources 1100 may be mounted on the board body 1210. Some of the plurality of light sources 1100 may be mounted on the front surface of the board body 1210. The front surface of the board body 1210 refers to one surface of the board body 1210 in the direction in which the board body 1210 faces the display panel 20.

The board body 1210 may be composed of a printed circuit board on which the light source 1100 is mounted and the power supply line 1230 described above is provided.

The reflective sheet 120 may be attached to the front surface of the board body 1210. According to one or more embodiments, an integrated reflective sheet 120 may be attached to the front surface of the board body 1210 and the plurality of board bars 1220. In this case, the uniformity of luminance due to the light reflected by the reflective sheet 120 may be improved, and the process of attaching the reflective sheet 120 to the front surface of the board body 1210 and the plurality of board bars 1220 may be simplified. However, the present disclosure is not limited thereto, and the plurality of reflective sheets 120, which is distinct from each other, may be attached to the front surfaces of the board body 1210 and the plurality of board bars 1220.

The board body 1210 may be mounted on the bottom chassis 15. Because the board body 1210 is mounted on the bottom chassis 15 and maintains a fixed position, the plurality of light sources 1100 mounted on the board body 1210 may be stably disposed at each designed position. In addition, because the board body 1210 is mounted on the bottom chassis 15, the plurality of board bars 1220 connected to the board body 1210 may be more stably supported by the board body 1210.

A structure configured to allow the board body 1210 to be fixed to the bottom chassis 15 will be described later.

The display apparatus 1 may include a connector 1300. The connector 1300 may be electrically connected to the plurality of light sources 1100. The connector 1300 may be electrically connected to the light source board 1200. The connector 1300 may be electrically connected to various electronic components mounted on the light source board 1200, such as the plurality of light sources 1100, along the power supply line 1230 provided on the light source board 1200. Accordingly, the connector 1300 may transmit the electrical signal transmitted from the control assembly 50 to various electronic components mounted on the light source board 1200, such as the plurality of light sources 1100. The connector 1300 may transmit power supplied from the power assembly 60 to various electronic components mounted on the light source board 1200, such as the plurality of light sources 1100. In other words, the light source module 1000 may be electrically connected to the control assembly 50 and/or the power assembly 60 through the connector 1300.

According to one or more embodiments, the connector 1300 may be mounted on the board body 1210. Particularly, the connector 1300 may be mounted on a rear surface of the board body 1210 facing the bottom chassis 15.

As described above, the reflective sheet 120 may be attached to the front surface of the board body 1210, and thus when the connector 1300 is mounted on the front surface of the board body 1210, a portion of the reflective sheet 120, which is in a position corresponding to the mounting position of the connector 1300, may interfere with the connector 1300, and the uniformity of luminance of the display apparatus 1 may deteriorate. Alternatively, in one or more embodiments of the present disclosure, as the connector 1300 is mounted on the rear surface of the board body 1210, it is possible to prevent the reduction of the uniformity of luminance of the display apparatus 1.

According to one or more embodiments, the board body 1210 and the plurality of board bars 1220 may be formed integrally with each other. In other words, the board body 1210 and the plurality of board bars 1220 may be connected to each other to form an integrated light source board 1200. The light source board 1200 may be composed of a printed circuit board including the board body 1210 and the plurality of board bars 1220. Alternatively, the board body 1210 and the plurality of board bars 1220 may be separate parts that are not integrally formed with each other and connected through an assembly process.

The structure of the light source module 1000, such as the board body 1210 and the board bar 1220, described above with reference to FIG. 6 is only an example of one or more embodiments, and the present disclosure is not limited thereto.

FIG. 6 illustrates one embodiment in which each of the plurality of board bars 1220 extends from the board body 1210 in the right direction (+Y direction), but is not limited thereto. According to one or more embodiments, the plurality of board bars 1220 may extend from the board body 1210 in the left direction (−Y direction)

In addition, FIG. 6 illustrates one embodiment in which the board body 1210 extends in the vertical direction (Z direction) of the display apparatus 1, but is not limited thereto. According to one or more embodiments, the board body 1210 may extend in the horizontal direction (Y direction).

In addition, FIG. 6 illustrates one or more embodiments in which each of the plurality of board bars 1220 extends in the horizontal direction (Y direction) from one side, which is in the horizontal direction (Y direction), of the board body 1210, but is not limited thereto, and each of the plurality of board bars 1220 may extend in the vertical direction (Z direction) from one side, which is in the vertical direction (Z direction), of the board body 1210. In this case, the plurality of board bars 1220 may be arranged to be spaced apart from each other in the horizontal direction (Y direction).

In addition, unlike the above-mentioned description, a first direction that is the width direction of each of the plurality of board bars 1220, or a first direction in which the plurality of board bars 1220 is spaced apart from each other, or a first direction in which the board body 1210 extends or a second direction in which each of the plurality of board bars 1220 extends may not be parallel to either the vertical direction (Z direction) or the horizontal direction (Y direction) of the display apparatus 1.

However, hereinafter for convenience of description, the present disclosure will be described based on the one or more embodiments in which the first direction is parallel to the vertical direction (Z direction) of the display apparatus 1, and the second direction is parallel to the horizontal direction (Y direction) of the display apparatus 1.

Referring to FIGS. 7 to 19, in the display apparatus 1 according to one or more embodiments, the light source board 1200 may be mounted on the bottom chassis 15. Particularly, the display apparatus 1 may include a board fixer 200 (refer to FIG. 8, etc.), and the board fixer 200 may fix the light source board 1200 to the bottom chassis 15. That is, the light source board 1200 may be mounted on the bottom chassis 15 through the board fixer 200.

The board fixer 200 may be composed of various types of members including a structure that fixes the light source board 1200 to the bottom chassis 15. Particularly, the board fixer 200 may be composed of various types of members including a structure that are coupled to the light source board 1200 and mountable on the bottom chassis 15.

Hereinafter with reference to FIGS. 7 to 19, in the display apparatus 1 according to one or more embodiments of the present disclosure, a structure in which the light source board 1200 is mounted and fixed to the bottom chassis 15 by the board fixer 200 will be described in details.

Figure 7:
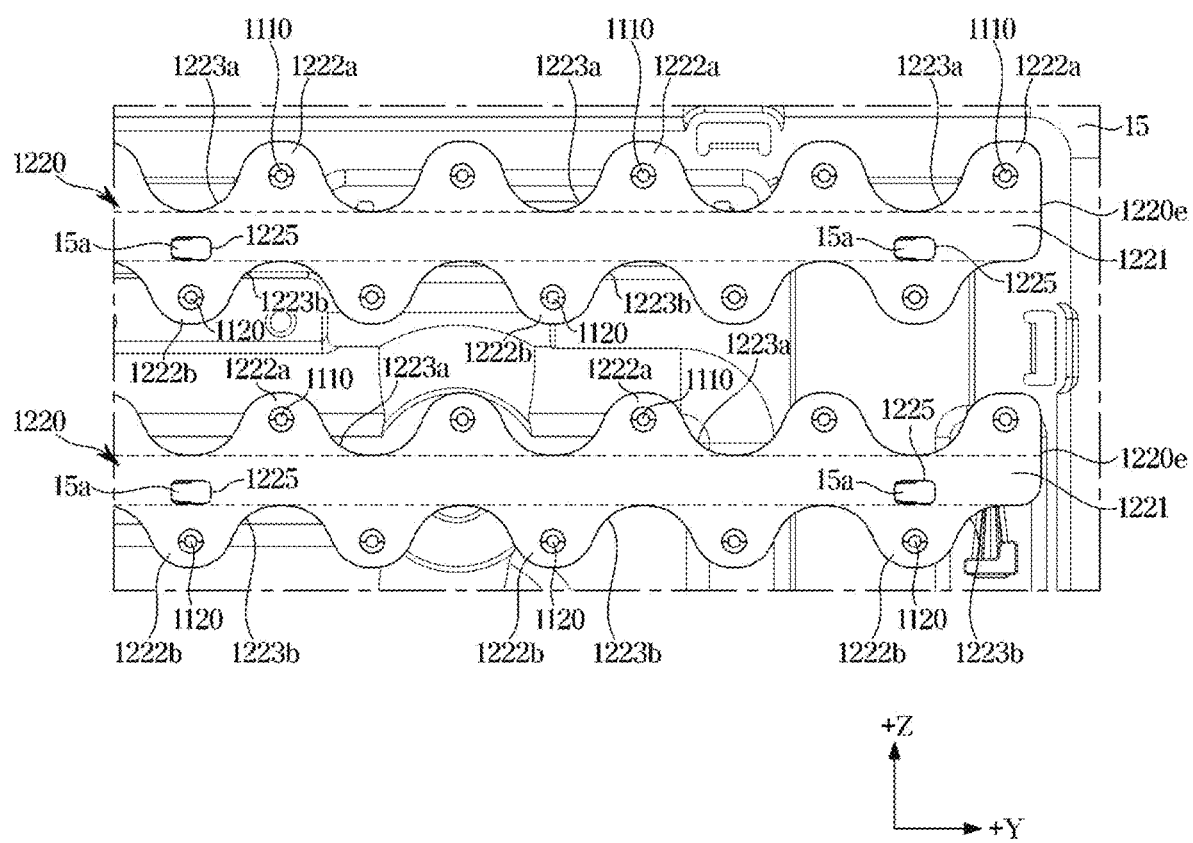
FIG. 7 is an enlarged view of a portion of a board bar and the bottom chassis of the display apparatus according to one or more embodiments.

FIG. 7 is an enlarged view of a portion of a board bar and the bottom chassis of the display apparatus according to one or more embodiments.

Referring to FIG. 7, the plurality of board bars 1220 included in the display apparatus 1 according to one or more embodiments may be mounted on the bottom chassis 15. The plurality of board bars 1220 may be disposed in front of the bottom chassis 15. Each of the plurality of board bars 1220 may be fixed to the bottom chassis 15.

Figure 8:
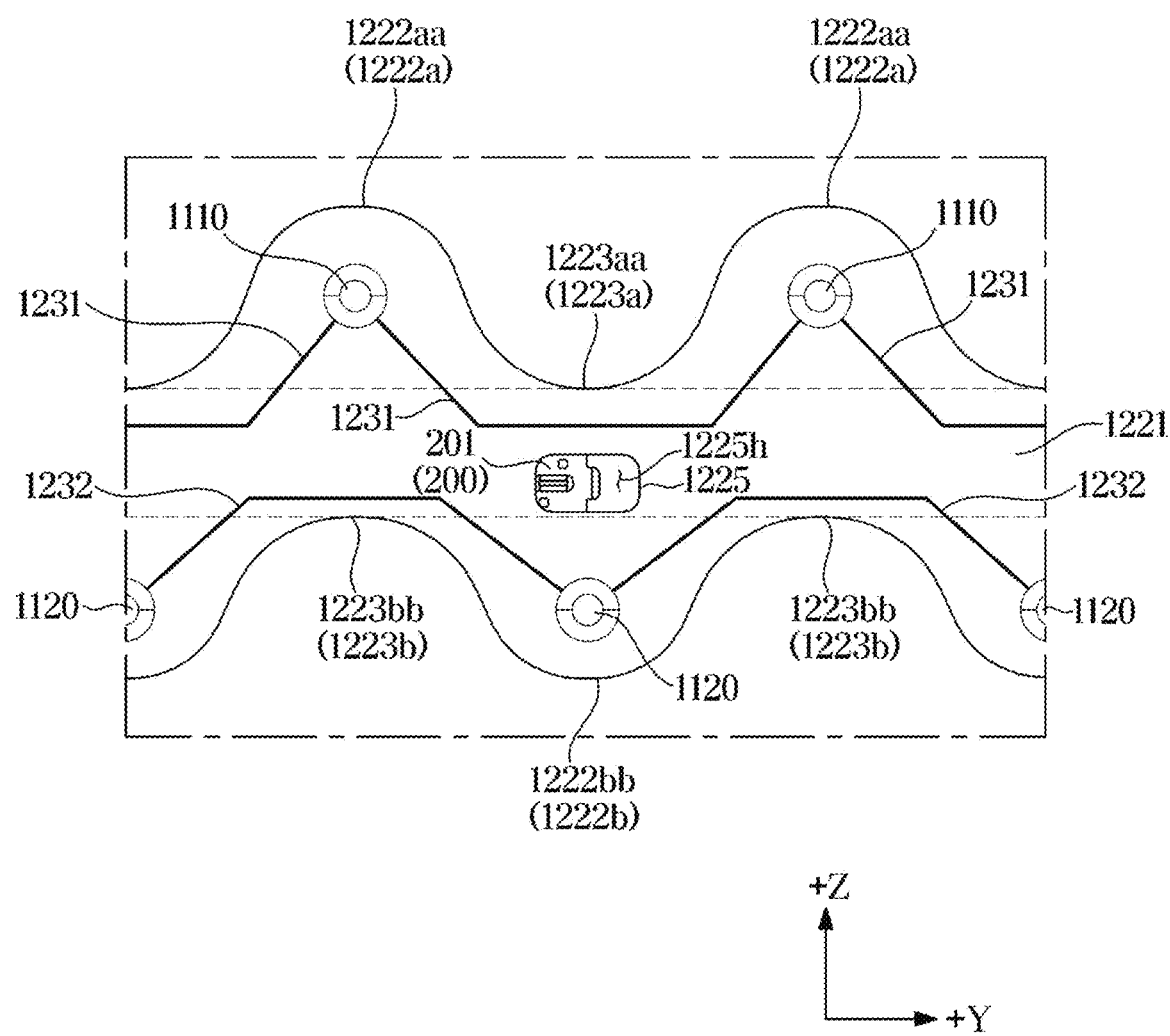
FIG. 8 is a view illustrating the board bar and a bar fixer coupled thereto of the display apparatus according to one or more embodiments.

The display apparatus 1 may include a bar fixer 201 (refer to FIG. 8, etc.). The bar fixer 201 may be provided to fix the board bar 1220 to the bottom chassis 15. A plurality of bar fixers 201 may be provided, and the plurality of bar fixers

201 may be provided to fix the plurality of board bars 1220 to the bottom chassis 15. The plurality of bar fixers 201 may be provided to fix the plurality of board bars 1220 to the bottom chassis 15 such that the plurality of board bars 1220 are attached to the bottom chassis 15 and the plurality of board bars 1220 are immovable from the bottom chassis 15. The bar fixer 201 may be a type of the board fixer 200 described above. That is, the plurality of board fixers 200 may include the bar fixer 201. At least some of the plurality of board fixers 200 (i.e., the bar fixer 201) may be provided to fix the board bar 1220 to the bottom chassis 15.

The bar fixer 201 may be provided to be mounted on the bottom chassis 15. The bottom chassis 15 may include a mounting portion 15a on which the bar fixer 201 is mounted. The bar fixer 201 may be fixed to the bottom chassis 15 by being mounted on the mounting portion 15a. As the bar fixer 201 is mounted on the bottom chassis 15, the board bar 1220 may be fixed to the bottom chassis 15. The bottom chassis 15 may include a plurality of mounting portions 15a, and the plurality of mounting portions 15a may be provided in the number corresponding to the number of the plurality of bar fixers 201.

At least one bar fixer 201 may be disposed on each of the plurality of board bars 1220. Accordingly, the plurality of board bars 1220 may be respectively mounted on the bottom chassis 15 and fixed to the bottom chassis 15, respectively.

Each of the plurality of board bars 1220 may include a coupling portion 1225. Each of the plurality of board bars 1220 may be coupled to the bottom chassis 15 through the coupling portion 1225. The bar fixer 201 may be disposed at the coupling portion 1225 of each of the plurality of board bars 1220. Particularly, the bar fixer 201 may be coupled to the coupling portion 1225 of each of the plurality of board bars 1220. That is, the number of coupling portions 1225 may correspond to the number of bar fixers 201. The coupling portion 1225 of the board bar 1220 may also be referred to as 'bar coupling portion 1225.'

The bar fixer 201 may be disposed on the coupling portion 1225 of the board bar 1220 to couple the coupling portion 1225 to the bottom chassis 15. As the bar fixer 201 is mounted on the mounting portion 15a of the bottom chassis 15, the board bar 1220 may be fixed to the bottom chassis 15.

In other words, each of the plurality of bar fixers 201 may be disposed on the coupling portion 1225 formed on the corresponding board bar 1220 among the plurality of board bars 1220. Each of the plurality of bar fixers 201 may couple the coupling portion 1225, which is formed on each corresponding board bar 1220 among the plurality of board bars 1220, to the bottom chassis 15.

According to one or more embodiments, each of the plurality of bar fixers 201 may be detachably mounted on the bottom chassis 15. Accordingly, each of the plurality of board bars 1220 may be detachably mounted on the bottom chassis 15.

With this configuration, the plurality of board bars 1220 may be efficiently fixed to the bottom chassis 15. As the plurality of board bars 1220 is stably fixed to the bottom chassis 15, the durability of the product may be improved and the performance of the product may be improved.

A structure included in the bar fixer 201 will be described later.

Referring to FIG. 7, the board bar 1220 may include a central extending portion 1221 extending in one direction. The central extending portion 1221 may be a part of the board bar 1220 and may form a part of the light source board 1200. Each of the plurality of board bars 1220 may include the central extending portion 1221.

The central extending portion 1221 may extend in the second direction (Y direction). A width direction of the central extending portion 1221 may be parallel to the first direction (Z direction). The central extending portion 1221 may have a shape in which an extension length in the second direction (Y direction) is greater than a width in the first direction (Z direction).

The central extending portion 1221 may be provided in a central portion of the board bar 1220. The central extending portion 1221 may include a region that passes through the center of the board bar 1220 and extends in the second direction (Y direction).

In other words, the central extending portion 1221 may extend to pass through the center of each board bar 1220 in the second direction Y.

According to one or more embodiments, as shown in FIG. 7, the central extending portion 1221 may be defined as a substantially rectangular bar-shaped region.

Referring to FIG. 7, the board bar 1220 may include a first protrusion 1222a. The first protrusion 1222a may be a part of the board bar 1220 and may form a part of the light source board 1200.

The first protrusion 1222a may protrude from one side of the central extending portion 1221. The first protrusion 1222a may protrude from one side of the central extending portion 1221 in the first direction (+Z direction). The first protrusion 1222a may extend from the central extending portion 1221 in the first direction (+Z direction). According to one or more embodiments, the first protrusion 1222a may extend upward from an upper side of the central extending portion 1221.

According to one or more embodiments, the first protrusion 1222a may be connected to the central extending portion 1221 and formed as one piece.

According to one or more embodiments, in one board bar 1220, a plurality of first protrusions 1222a may be provided. That is, the board bar 1220 may include the plurality of first protrusions 1222a.

The plurality of first protrusions 1222a may be arranged along the second direction (Y direction). According to one or more embodiments, the plurality of first protrusions 1222a may be arranged in such a way that positions thereof in the first direction Z (i.e., the vertical height of the display apparatus 1) corresponds to each other. According to one or more embodiments, the plurality of first protrusions 1222a may be arranged at equal intervals along the second direction (Y direction).

According to one or more embodiments, the plurality of first protrusions 1222a may be formed to have shapes that correspond to each other. According to one or more embodiments, a length of each of the plurality of first protrusions 1222a protruding from the central extending portion 1221 to the first direction (Z direction) may correspond to each other.

Some of the plurality of light sources 1100 mounted on the board bar 1220 may be mounted on the plurality of first protrusions 1222a. Hereinafter the light source mounted on each of the plurality of first protrusions 1222a will be referred to as 'first side light source 1110.' According to one or more embodiments, a single first side light source 1110 may be mounted on a single first protrusion 1222a, but the present disclosure is not limited thereto.

The plurality of first side light sources 1110 may be disposed at positions spaced apart from the central extending portion 1221 to the first direction (Z direction). As shown in FIG. 7, the plurality of first side light sources 1110 may be arranged to be biased upward from the central extending portion 1221.

The plurality of first side light sources 1110 may be arranged along the second direction (Y direction). According to one or more embodiments, the plurality of first side light sources 1110 may be arranged in such a way that positions thereof in the first direction Z correspond to each other. According to one or more embodiments, the plurality of first side light sources 1110 may be arranged at equal intervals along the second direction (Y direction).

Referring to FIG. 7, the board bar 1220 may include a second protrusion 1222b. The second protrusion 1222b may be a part of the board bar 1220 and may form a part of the light source board 1200.

The second protrusion 1222b may protrude from the other side of the central extending portion 1221. The second protrusion 1222b may protrude from the other side of the central extending portion 1221 to the first direction (Z direction). The other side of the central extending portion 1221 means the other side different from the one side of the central extending portion 1221 on which the first protrusion 1222a protrudes. According to one or more embodiments, the second protrusion 1222b may be the other side of the central extending portion 1221 that is opposite to the one side of the central extending portion 1221, on which the first protrusion 1222a protrudes, and protrudes in a direction opposite to a protruding direction of the first protrusion 1222a.

The second protrusion 1222b may extend from the central extending portion 1221 to the first direction (Z direction). According to one or more embodiments, the second protrusion 1222b may extend downward from the lower side of the central extending portion 1221.

According to one or more embodiments, the second protrusion 1222b may be connected to the central extending portion 1221 and formed as one piece.

According to one or more embodiments, a plurality of second protrusions 1222b may be provided in a single board bar 1220. That is, the board bar 1220 may include the plurality of second protrusions 1222b.

The plurality of second protrusions 1222b may be arranged along the second direction (Y direction). According to one or more embodiments, the plurality of second protrusions 1222b may be arranged in such a way that positions thereof in the first direction Z (i.e., the vertical height of the display apparatus 1) correspond to each other. According to one or more embodiments, the plurality of second protrusions 1222b may be arranged at equal intervals along the second direction (Y direction).

According to one or more embodiments, the plurality of second protrusions 1222b may be formed to have shapes that correspond to each other. According to one or more embodiments, a length of each of the plurality of second protrusions 1222b protruding from the central extending portion 1221 to the first direction (Z direction) may correspond to each other.

According to one or more embodiments, the length, at which each of the plurality of first protrusions 1222a protrudes from the central extending portion 1221, and the length, at which each of the plurality of second protrusions 1222b protrudes from the central extending portion 1221, may be approximately equal to each other. According to one or more embodiments, the shape of each of the plurality of first protrusions 1222a and the shape of each of the plurality of second protrusions 1222b may correspond to each other.

Some of the plurality of light sources 1100 mounted on the board bar 1220 may be mounted on the plurality of second protrusions 1222b. Hereinafter the light source mounted on each of the plurality of second protrusions 1222b will be referred to as 'second side light source 1120.' According to one or more embodiments, a single second side light source 1120 may be mounted on a single second protrusion 1222b, but is not limited thereto.

The plurality of second side light sources 1120 may be disposed at positions spaced apart from the central extending portion 1221 to the first direction (Z direction). As shown in FIG. 7, the plurality of second side light sources 1120 may be arranged to be biased downward from the central extending portion 1221.

The plurality of second side light sources 1120 may be arranged along the second direction (Y direction). According to one or more embodiments, the plurality of second side light sources may be arranged in such a way that positions thereof in the first direction Z correspond to each other. According to one or more embodiments, the plurality of second side light sources 1120 may be arranged at equal intervals along the second direction (Y direction).

Some regions of the central extending portion 1221, in which the plurality of first protrusions 1222a protrudes, and other regions of the central extending portion 1221, in which the plurality of second protrusions 1222b extends, may intersect with respect to the second direction (Y direction). In other words, the first protrusion 1222a and the second protrusion 1222b may be arranged to cross each other. In a single board bar 1220, the plurality of first protrusions 1222a and the plurality of second protrusions 1222b may be arranged not to be parallel to each other (i.e. offset) in the first direction Z.

With this configuration, the first side light source 1110 and the second side light source 1120 may be arranged to cross each other along the second direction (Y direction). In a single board bar 1220, the plurality of light sources 1100 may be arranged in such a way that the first side light source 1110 disposed on one side in the first direction Z and the second side light source 1120 disposed on the other side are arranged to cross each other along the direction (Y direction). In other words, in a single board bar 1220, the plurality of light sources 1100 may be arranged in such a way that the first side light source 1110 disposed on one side in the first direction Z and the second side light source 1120 disposed on the other side are arranged to across from each other along a central axis of the single board bar 1220 in the Z direction. Accordingly, the uniformity of luminance by the plurality of light sources 1100 may be improved. That is, in a single board bar 1220, the plurality of light sources 1100 may be arranged in a zigzag pattern.

The board bar 1220 may include a plurality of first recess portions 1223a. Each of the plurality of first recess portions 1223a may be formed between a pair of adjacent first protrusions 1222a among the plurality of first protrusions 1222a. That is, the first recess portion 1223a may be defined as a partial region of the board bar 1220 formed between the pair of adjacent first protrusions 1222a.

The plurality of first recess portions 1223a may be provided on one side of the central extending portion 1221 with respect to the first direction Z. According to one or more embodiments, the plurality of first recess portions 1223a may be provided on the upper side of the central extending portion 1221.

The plurality of first recess portions 1223a may be formed to have a shape that is relatively concavely recessed toward the inside of the central extending portion 1221 in comparison with the plurality of first protrusions 1222a.

The plurality of first recess portions 1223*a* may be arranged along the second direction (Y direction). According to one or more embodiments, the plurality of first recess portions 1223*a* may be arranged in such a way that positions thereof in the first direction Z (i.e., the vertical height of the display apparatus 1) According to one or more embodiments, the plurality of first recess portions 1223*a* may be arranged at equal intervals along the second direction (Y direction).

According to one or more embodiments, the plurality of first recess portions 1223*a* may be formed to have shapes that correspond to each other.

The board bar 1220 may include a plurality of second recess portions 1223*b*. Each of the plurality of second recess portions 1223*b* may be formed between a pair of adjacent second protrusions 1222*b* among the plurality of second protrusions 1222*b*. That is, the second recess portion 1223*b* may be defined as a partial region of the board bar 1220 formed between the pair of adjacent second protrusions 1222*b*.

The plurality of second recess portions 1223*b* may be provided on the other side of the central extending portion 1221 with respect to the first direction Z. The other side of the central extending portion 1221 means the other side different from the one side of the central extending portion 1221 in which the first recess portion 1223*a* is provided. According to one or more embodiments, the plurality of second recess portions 1223*b* may be provided on the lower side of the central extending portion 1221.

The plurality of second recess portions 1223*b* may be formed to have a shape that is relatively concavely recessed toward the inside of the central extending portion 1221 in comparison with the plurality of second protrusions 1222*b*.

The plurality of second recess portions 1223*b* may be arranged along the second direction (Y direction). According to one or more embodiments, the plurality of second recess portions 1223*b* may be arranged in such a way that positions thereof in the first direction Z (i.e., the vertical height of the display apparatus 1) correspond to each other. According to one or more embodiments, the plurality of second recess portions 1223*b* may be arranged at equal intervals along the second direction (Y direction).

According to one or more embodiments, the plurality of second recess portions 1223*b* may be formed to have shapes that correspond to each other.

Some regions of the central extending portion 1221, in which the plurality of first recess portions 1223*a* is provided, and other regions of the central extending portion 1221, in which the plurality of second recess portions 1223*b* is provided, may intersect with respect to the second direction (Y direction). In other words, the first recess portion 1223*a* and the second recess portions 1223*b* may be arranged to cross each other. In a single board bar 1220, the plurality of first recess portions 1223*a* and the plurality of second recess portions 1223*b* may be arranged not to be parallel to each other (i.e. offset) in the first direction Z.

According to one or more embodiments, each of the plurality of first protrusions 1222*a* may be arranged side by side in the first direction Z with the most adjacent second recess portion 1223*b* among the plurality of second recess portions 1223*b*. That is, the plurality of first protrusions 1222*a* and the plurality of second recess portions 1223*b* may be arranged side by side in the first direction Z.

Further, each of the plurality of second protrusions 1222*b* may be arranged side by side in the first direction Z with the most adjacent first recess portion 1223*a* among the plurality of first recess portions 1223*a*. That is, the plurality of second protrusions 1222*b* and the plurality of first recess portions 1223*a* may be arranged side by side in the first direction Z.

Accordingly, the board bar 1220 may have an overall shape that extends in a zigzag pattern.

According to one or more embodiments, the shape of each of the plurality of first recess portions 1223*a* and the shape of each of the plurality of second recess portions 1223*b* may correspond to each other.

In each of the plurality of board bars 1220, the coupling portion 1225 may be located on the above-described central extending portion 1221. The coupling portion 1225 may be located at the center of the board bar 1220 with respect to the width direction (i.e., the first direction Z). At this time, that the coupling portion 1225 is located at the center of the board bar 1220 with respect to the width direction does not necessarily mean that the center of the coupling portion 1225 exactly coincides with the center of the board bar 1220 with respect to the first direction Z or that a straight line passing through the center of the board bar 1220 in the second direction Y passes through the center of the coupling portion 1225. Particularly, it is sufficient that the coupling portion 1225 is located in a position adjacent to the center of the board bar 1220 with respect to the first direction Z on the central extension portion 1221. That is, the coupling portion 1225 may be formed at a specific position on a straight line passing through the center, which is in the first direction Z, of the board bar 1220 in the second direction Y. Alternatively, the coupling portion 1225 may be formed in a region, which is adjacent within a predetermined distance from a straight line passing through the center, which is in the first direction Z, of the board bar 1220 in the second direction Y, on the board bar 1220.

In other words, each of the plurality of bar fixers 201 may be disposed on the central extending portion 1221 of the corresponding board bar 1220. Each of the plurality of bar fixers 201 may be located at the center of the corresponding board bar 1220 with respect to the width direction (i.e., the first direction Z).

In each of the plurality of board bars 1220, the coupling portion 1225 may be located on one side, which is in the first direction Z, of one light source 1100 among the plurality of light sources 1100 mounted on the corresponding board bar 1220. The coupling portion 1225 may be disposed in a position parallel to one of the light sources 1100, which is among the plurality of light sources 1100 mounted on the corresponding board bar 1220, with respect to the width direction (i.e., the first direction Z). At this time, that the coupling portion 1225 is located on one side of one light source 1100 with respect to the first direction Z does not necessarily mean that the center of the coupling portion 1225 and the center of the light source 1100 are located simultaneously on a straight line extending in the first direction Z. Particularly, it is sufficient that the coupling portion 1225 is located adjacent to a straight line passing through one light source 1100 in the first direction Z. That is, the coupling portion 1225 may be formed at a specific position, which is on a straight line passing through one light source 1100 in the first direction Z, on the board bar 1220. Alternatively, the coupling portion 1225 may be disposed on a region, which is adjacent to the board bar 1220 within a predetermined distance from a straight line passing through one light source 1100 in the first direction Z, on the board bar 1220. One light source 1100 may be one of the plurality of first side light sources 1110 or one of the plurality of second side light sources 1120.

The coupling portion 1225 may be arranged parallel to either the first plurality of protrusions 1222*a* or the plurality of second protrusions 1222b with respect to the first direction Z. In other words, the coupling portion 1225 may be arranged side by side in the first direction Z with one first protrusion 1222a among the plurality of first protrusions 1222a or the coupling portion 1225 may be arranged side by side in the first direction Z with one second protrusion 1222b among the plurality of second protrusions 1222b.

In other words, each of the plurality of bar fixers 201 may be located on one side, which is in the first direction Z, of one light source 1100 among the plurality of light sources 1100 mounted on the corresponding board bar 1220. Each of the plurality of bar fixers 201 may be arranged side by side in the first direction Z with one light source 1100 among the plurality of light sources 1100 mounted on the corresponding board bar 1220. Each of the plurality of bar fixers 201 may be arranged at a position parallel to either one of the plurality of first protrusions 1222a or the plurality of second protrusions 1222b on the corresponding board bar 1220, with respect to the first direction Z.

Accordingly, the coupling portion 1225 in each of the plurality of board bars 1220 may be located on the central extending portion 1221 of each board bar 1220 and located on one side, which is in the first direction Z, of one light source (e.g., either the first side light source 1110 or the second side light source 1120) among the plurality of light sources 1100 mounted on the board bar 1220. In other words, the coupling portion 1225 in each of the plurality of board bars 1220 may be disposed at the center with respect to the width direction of each board bar 1220, and may be disposed in a position parallel to one light source 1100, which is among the plurality of light sources 1100 mounted on the board bar 1220, with respect to the width direction. In other words, the coupling portion 1225 in each of the plurality of board bars 1220 may be arranged side by side in the first direction Z with one of the plurality of first protrusions 1222a or the plurality of second protrusions 1222b, on the corresponding central extending portion 1221.

In addition, each of the plurality of bar fixers 201 may be disposed on the coupling portion 1225 formed at the above-mentioned position, so as to allow the coupling portion 1225 to be coupled to the mounting portion 15a of the bottom chassis 15.

According to one or more embodiments, at least some of the plurality of bar fixers 201 may be disposed adjacent to an end of at least one board bar 1220 among the plurality of board bars 1220. In other words, at least some of the plurality of coupling portions 1225 provided on the plurality of board bars 1220 may be disposed adjacent to the end of the board bar 1220. The end of the board bar 1220 may refer to one end of the board bar 1220 with respect to a direction, in which the board bar 1220 extends from the board body 1210 in the second direction Y, and may refer to one end opposite to the board body 1210 of the board bar 1220. As the board bar 1220 is elongated from the board body 1210, there is a risk that the end opposite to the board body 1210 may not be effectively supported by the board body 1210. However, the bar fixer 201 may be located adjacent thereto and couple the coupling portion 1225 to the bottom chassis 15. Accordingly, the end of the board bar 1220 may efficiently maintain the fixed position.

According to one or more embodiments, the coupling portion 1225 formed on each of the plurality of board bars 1220 may be arranged side by side. According to one or more embodiments, as shown in FIG. 7, the coupling portion 1225 formed on each of the plurality of board bars 1220 may be arranged side by side in the first direction Z. Accordingly, the coupling portion 1225 formed on each of the plurality of board bars 1220 may be disposed on the central extending portion 1221 of each board bar 1220 and at the same time, disposed on a straight line connecting the light sources 1100, which are arranged side by side among the plurality of light sources 1100 mounted on the plurality of board bars 1220, in the first direction Z.

Therefore, the plurality of bar fixers 201 may be arranged side by side with each other. As shown in FIG. 7, the plurality of bar fixers 201 may be arranged side by side in the first direction Z.

According to one or more embodiments, as shown in FIG. 7, one board bar 1220 of the plurality of board bars 1220 may be fixed to the bottom chassis 15 by the plurality of bar fixers 201, and the plurality of coupling portions 1225 may be formed on one board bar 1220.

At this time, in one board bar 1220, the plurality of coupling portions 1225 may be arranged side by side in the second direction Y. Therefore, the plurality of bar fixers 201 disposed on one board bar 1220 may be arranged side by side in the second direction Y.

According to one or more embodiments, among the plurality of coupling portions 1225 formed on a single board bar 1220, some coupling portions 1225 may be formed adjacent to an end portion 1220e of the board bar 1220, and other some of the coupling portions 1225 may be formed at a position between the coupling portion 1225, which is formed adjacent to the end portion 1220e of the board bar 1220, and the board body 1210. Further, the plurality of coupling portions 1225 formed at positions adjacent to the end portion 1220e of each of the plurality of board bars 1220 may be arranged side by side along the first direction Z. In addition, the plurality of coupling portions 1225 formed at the position between the board body 1210 and the coupling portion 1225 formed at the position adjacent to the end portion 1220e of each of the plurality of board bars 1220 may be arranged side by side along the first direction Z.

Alternatively, a single coupling portion 1225 may be formed on a single board bar 1220, and the single board bar 1220 may be fixed to the bottom chassis 15 by a single bar fixer 201.

Figure 9:
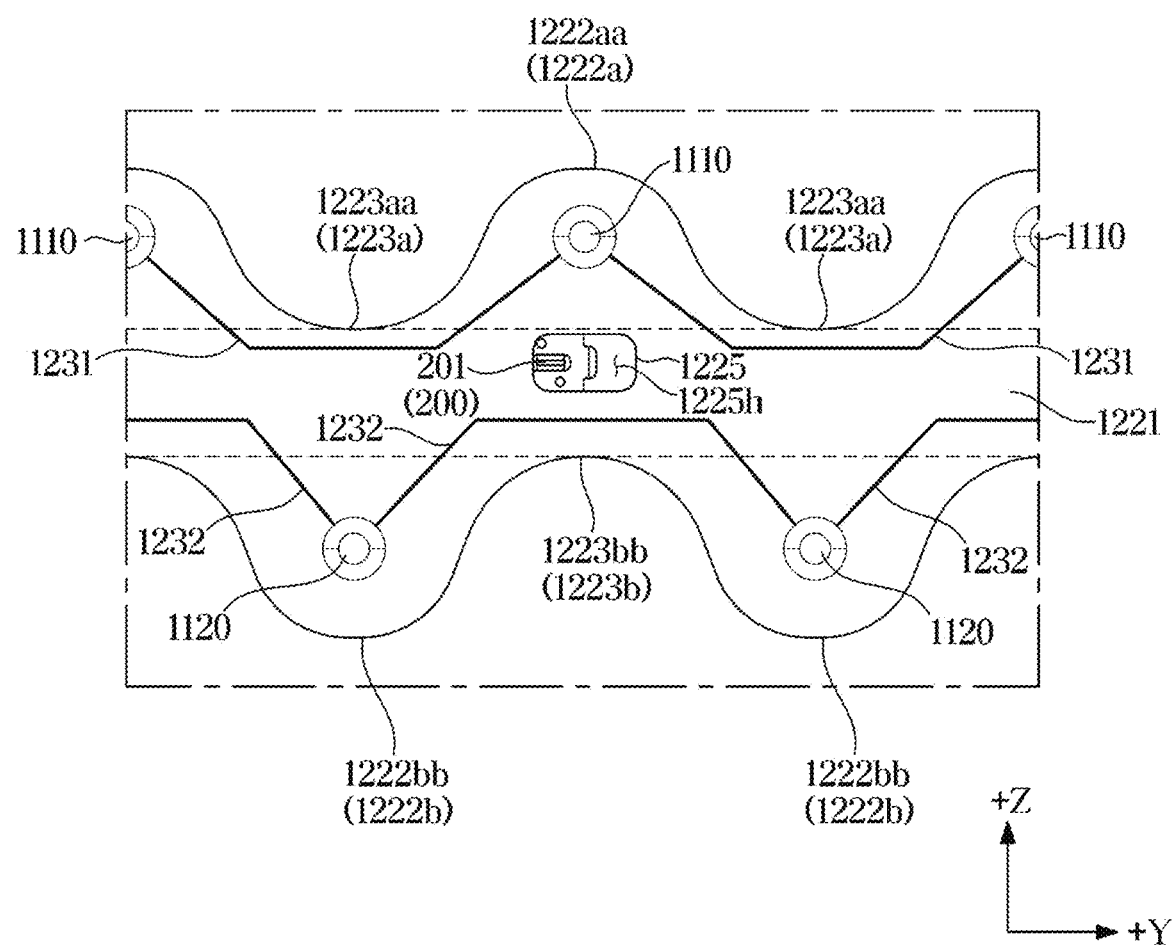
FIG. 9 is a view illustrating the board bar and the bar fixer coupled thereto of the display apparatus according to one or more embodiments.

FIG. 8 is a view illustrating the board bar and a bar fixer coupled thereto of the display apparatus according to one or more embodiments. FIG. 9 is a view illustrating the board bar and the bar fixer coupled thereto of the display apparatus according to one or more embodiments.

FIGS. 8 and 9 illustrate one board bar 1220 among the plurality of board bars 1220 included in the display apparatus 1 according to one or more embodiments, but a description of characteristics of one board bar 1220 described above with reference to FIGS. 8 and 9 may be applied correspondingly to characteristics of each of the plurality of board bars 1220.

FIGS. 8 and 9 illustrate one bar fixer 201 among the plurality of bar fixers 201 included in the display apparatus 1 according to one or more embodiments, but a description of characteristics of one bar fixer 201 described above with reference to FIGS. 8 and 9 may be applied correspondingly to characteristics of each of the plurality of bar fixers 201.

Referring to FIGS. 8 and 9, the plurality of light sources 1100 mounted on a single board bar 1220 included in the display apparatus 1 according to one or more embodiments may be spaced apart from the central extending portion 1221.

According to one or more embodiments, the board bar 1220 may include the plurality of first side light sources 1110 disposed on one side with respect to the central extending portion 1221 of the board bar 1220, and the plurality of second side light sources 1120 disposed on the other side with respect to the central extending portion 1221 of the board bar 1220.

The board bar 1220 may include the power supply line 1230 (refer to FIG. 4) configured to supply power to the plurality of light sources 1100. The power supply line 1230 may be electrically connected to the plurality of light sources 1100, and may supply power to drive each of the light sources 1100 or transmit control signals to the plurality of light sources 1100.

The power supply line 1230 may include a first power supply line 1231 disposed along the position in which the plurality of first side light sources 1110 is arranged. The first line 1231 may be electrically connected to the plurality of first side light sources 1110. The plurality of first side light sources 1110 may be electrically connected to each other through the first line 1231.

According to one or more embodiments, the first line 1231 may be disposed at a position spaced apart from the center of the board bar 1220 with respect to the first direction Z. In other words, the first line 1231 may be arranged to be spaced apart from a straight line passing through the center, which is in the first direction Z, of the board bar 1220 in the second direction Y.

In this case, as shown in FIGS. 8 and 9, the first line 1231 may be arranged to allow a portion of the first line 1231 to overlap the central extending portion 1221. Alternatively, the first line 1231 may be spaced apart from the central extending portion 1221 and disposed outside the central extending portion 1221.

The power supply line 1230 may include a second power supply line 1232 disposed along a position in which the plurality of second side light sources 1120 is arranged. The second line 1232 may be electrically connected to the plurality of second side light sources 1120. The plurality of second side light sources 1120 may be electrically connected to each other through the second line 1232.

According to one or more embodiments, the second line 1232 may be disposed at a position spaced apart from the center of the board bar 1220 with respect to the first direction Z. In other words, the second line 1232 may be arranged to be spaced apart from a straight line passing through the center, which is in the first direction Z, of the board bar 1220 in the second direction Y.

In this case, as shown in FIGS. 8 and 9, the second line 1232 may be arranged to allow a portion of the second line 1232 to overlap the central extending portion 1221. Alternatively, the second line 1232 may be spaced apart from the central extending portion 1221 and disposed on the outside of the central extending portion 1221.

According to one or more embodiments, the first line 1231 and the second line 1232 may be electrically connected to each other at one end of the board bar 1220, the board body 1210, etc. According to one or more embodiments, the first line 1231 and the second line 1232 may be connected to each other to form a part of a closed circuit.

The coupling portion 1225 may be arranged to be spaced apart from the first line 1231 to prevent interference with the first line 1231, that is, to avoid the first line 1231. Particularly, the coupling portion 1225 may be disposed at a position spaced apart from the first line 1231 in the first direction Z. According to one or more embodiments, the coupling portion 1225 may be disposed on the lower side of the first line 1231 (−Z direction).

The coupling portion 1225 may be arranged to be spaced apart from the second line 1232 to prevent interference with the second line 1232, that is, to avoid the second line 1232. Particularly, the coupling portion 1225 may be disposed at a position spaced apart from the second line 1232 in the first direction Z. According to one or more embodiments, the coupling portion 1225 may be disposed above the second line 1232 (+Z direction).

Because the bar fixer 201 is disposed at the coupling portion 1225 of the board bar 1220, it is appropriate that the coupling portion 1225 and the power supply line 1230 do not interfere with each other in order to smoothly supply power to the light source 1100. Particularly, as will be described later, the coupling portion 1225 may include a board hole 1225h. The board hole 1225h may be formed in a shape through which the board bar 1220 is penetrated in the front and rear direction (X direction) and thus it may be required that the coupling portion 1225 be provided in a location that avoids the power supply line 1230.

Accordingly, the coupling portion 1225 may be disposed between the first line 1231 and the second line 1232 of the power supply line 1230 to avoid the power supply line 1230.

Meanwhile, the first line 1231 and the second line 1232 may each be formed to have a predetermined thickness. In addition, according to some embodiments, the first line 1231 or the second line 1232 may each be formed to have a plurality of patterns.

Therefore, in order to prevent the coupling portion 1225 from interfering with the power supply line 1230, it is required that the coupling portion 1225 be provided to have a sufficient distance from the power supply line 1230, such as the first line 1231 and the second line 1232. When the coupling portion 1225 is disposed adjacent to a part of the power supply line 1230, such as the first line 1231 or the second line 1232, there is a risk that the power supply line 1230 is damaged in the process in which the bar fixer 201 is mounted on the coupling portion 1225. Further, when the coupling portion 1225 is disposed adjacent to a part of the power supply line 1230, a risk, in which the board hole 1225h overlaps the position of the power supply line 1230, is increased due to an error that is generated in the process in which the board hole 1225h is formed at the position of the coupling portion 1225 of the board bar 1220. Accordingly, there is a risk that the power supply line 1230 is damaged.

As mentioned above, the coupling portion 1225 may be required to be formed in a large area on the board bar 1220 so as not to interfere with the power supply line 1230.

As mentioned above, the coupling portion 1225 may be formed on the central extending portion 1221. Accordingly, the coupling portion 1225 may be formed at a position that is not excessively biased from the center of the board bar 1220 to one side in the first direction Z.

Further, as described above, the coupling portion 1225 may be located on one side, which is in the first direction Z, with respect to one light source 1100 among the plurality of light sources 1100 on the central extending portion 1221.

As illustrated in FIGS. 8 and 9, in one or more embodiments, each of the plurality of light sources 1100 may be arranged to be spaced outward from the central extending portion 1221. In this case, as for the power supply line 1230 disposed along the plurality of light sources 1100, it is expected that a distance in the first direction Z from a position connected to the plurality of light sources 1100 to the central extending portion 1221 is approximately the longest. Therefore, when the coupling portion 1225 is formed in a position in parallel with any one light source 1100 of the plurality of light sources 1100 with respect to the first direction Z on the central extending portion 1221, a risk, in which the coupling portion 1225 and the power supply lines 1230 interfere with each other, may be reduced.

According to one or more embodiments, as shown in FIG. 8, the coupling portion 1225 may be disposed in the central extending portion 1221 to be parallel with one second side light source 1120 among the plurality of second side light sources 1120 with respect to the first direction Z.

According to one or more embodiments, as shown in FIG. 8, the coupling portion 1225 may be disposed in the central extending portion 1221 to be parallel with one second protrusion 1222*b* among the plurality of second protrusions 1222*b* with respect to the first direction Z According to one or more embodiments, as shown in FIG. 8, the coupling portion 1225 may be disposed in the central extending portion 1221 to be parallel with an extreme end portion 1222*bb*, which is in the first direction Z, of one second protrusion 1222*b* among the plurality of second protrusions 1222*b*, with respect to the first direction Z. The extreme end portion 1222*bb*, which is in the first direction Z, of the second protrusion 1222*b* may mean an end portion of the second protrusion 1222*b* located furthest from the central extending portion 1221 with respect to the first direction Z.

According to one or more embodiments, as shown in FIG. 8, in the central extending portion 1221, the coupling portion 1225 may be disposed in a position through which a line, which connects an inner end portion 1223*aa* of the first recess portion 1223*a* with respect to the first direction Z to the extreme end portion 1222*bb* of the second protrusion 1222*b* with respect to the first direction Z, passes. The inner end portion 1223*aa* of the first recess portion 1223*a* with respect to the first direction Z may mean an inner end portion, which is most adjacent to the central extending portion 1221 with respect to the first direction Z, among edges of the first recess portion 1223*a*.

According to one or more embodiments, a radius of curvature of the edge of the first recess portion 1223*a* may be greater than a radius of curvature of the edge of the second protrusion 1222*b*. Accordingly, a width of the board bar 1220 with respect to the first direction Z may be the widest at a portion through which a line, which connects the inner end portion 1223*aa* of the first recess portion 1223*a* with respect to the first direction Z to the extreme end portion 1222*bb* of the second protrusion 1222*b* with respect to the first direction Z, passes. Therefore, it is appropriate that the coupling portion 1225 is formed in a position, through which a line, which connects the inner end portion 1223*aa* of the first recess portion 1223*a* with respect to the first direction Z to the extreme end portion 1222*bb* of the second protrusion 1222*b* with respect to the first direction Z, passes, in the central extending portion 1221.

According to one or more embodiments, as shown in FIG. 9, the coupling portion 1225 may be disposed in the central extending portion 1221 to be parallel with one first side light source 1110 among the plurality of first side light sources 1110 with respect to the first direction Z.

According to one or more embodiments, as shown in FIG. 9, the coupling portion 1225 may be disposed in the central extending portion 1221 to be parallel with one first protrusion 1222*a* among the plurality of first protrusions 1222*a* with respect to the first direction Z.

According to one or more embodiments, as shown in FIG. 9, the coupling portion 1225 may be disposed in the central extending portion 1221 to be parallel with an extreme end portion 1222*aa*, which is in the first direction Z, of one first protrusions 1222*a* among the plurality of first protrusions 1222*a* with respect to the first direction Z. The extreme end portion 1222*aa* of the first protrusions 1222*a* with respect to the first direction Z may mean an end portion of the first protrusions 1222*a* located furthest from the central extending portion 1221 in the first direction Z.

According to one or more embodiments, as shown in FIG. 9, in the central extending portion 1221, the coupling portion 1225 may be disposed in a position through which a line, which connects an inner end portion 1223*bb* of the second recess portion 1223*b* with respect to the first direction Z to the extreme end portion 1222*aa* of the first protrusion 1222*a* with respect to the first direction Z, passes. The inner end portion 1223*bb* of the second recess portion 1223*b* with respect to the first direction Z may mean an inner end portion, which is most adjacent to the central extending portion 1221 with respect to the first direction Z, among edges of the second recess portion 1223*b*.

According to one or more embodiments, a radius of curvature of the edge of the second recess portion 1223*b* may be greater than a radius of curvature of the edge of the first protrusion 1222*a*. Accordingly, a width of the board bar 1220 with respect to the first direction Z may be the widest at a portion through which a line, which connects the inner end portion 1223*bb* of the second recess portion 1223*b* with respect to the first direction Z to the extreme end portion 1222*aa* of the first protrusion 1222*a* with respect to the first direction Z, passes. Therefore, it is appropriate that the coupling portion 1225 is formed in a position through which a line, which connects the inner end portion 1223*bb* of the second recess portion 1223*b* with respect to the first direction Z to the extreme end portion 1222*aa* of the first protrusion 1222*a* with respect to the first direction Z, passes, in the central extending portion 1221.

With this structure, the coupling portion 1225 formed at the position, in which the bar fixer 201 is disposed on the board bar 1220, may be effectively prevented from interfering with the power supply line 1230, such as the first line 1231 and the second line 1232.

The position of the bar fixer 201 and the coupling portion 1225, in which the bar fixer 201 is disposed, described with reference to FIGS. 7 to 9 may be one or more embodiments of the position of the bar fixer, which is configured to fix the plurality of board bars to the bottom chassis, and the position, in which the coupling portion of the board bar, in which the bar fixer is disposed, is positioned, in the display apparatus according to the present disclosure and the present disclosure is not limited thereto.

Hereinafter one or more embodiments of a structure of the bar fixer 201, which is a type of the board fixer 200, and an embodiments of a structure for fixing the board bar 1220 to the bottom chassis 15 through the bar fixer 201 will be described particularly. However, the bar fixer 201 described below is only an example of an embodiments of a configuration for fixing the board bar 1220 to the bottom chassis 15, and the present disclosure is not limited thereto. According to one or more embodiments, in the display apparatus according to the present disclosure, the board bar may be fixed to the bottom chassis by various structural members such as brackets, clips, and fastening members.

Figure 10:
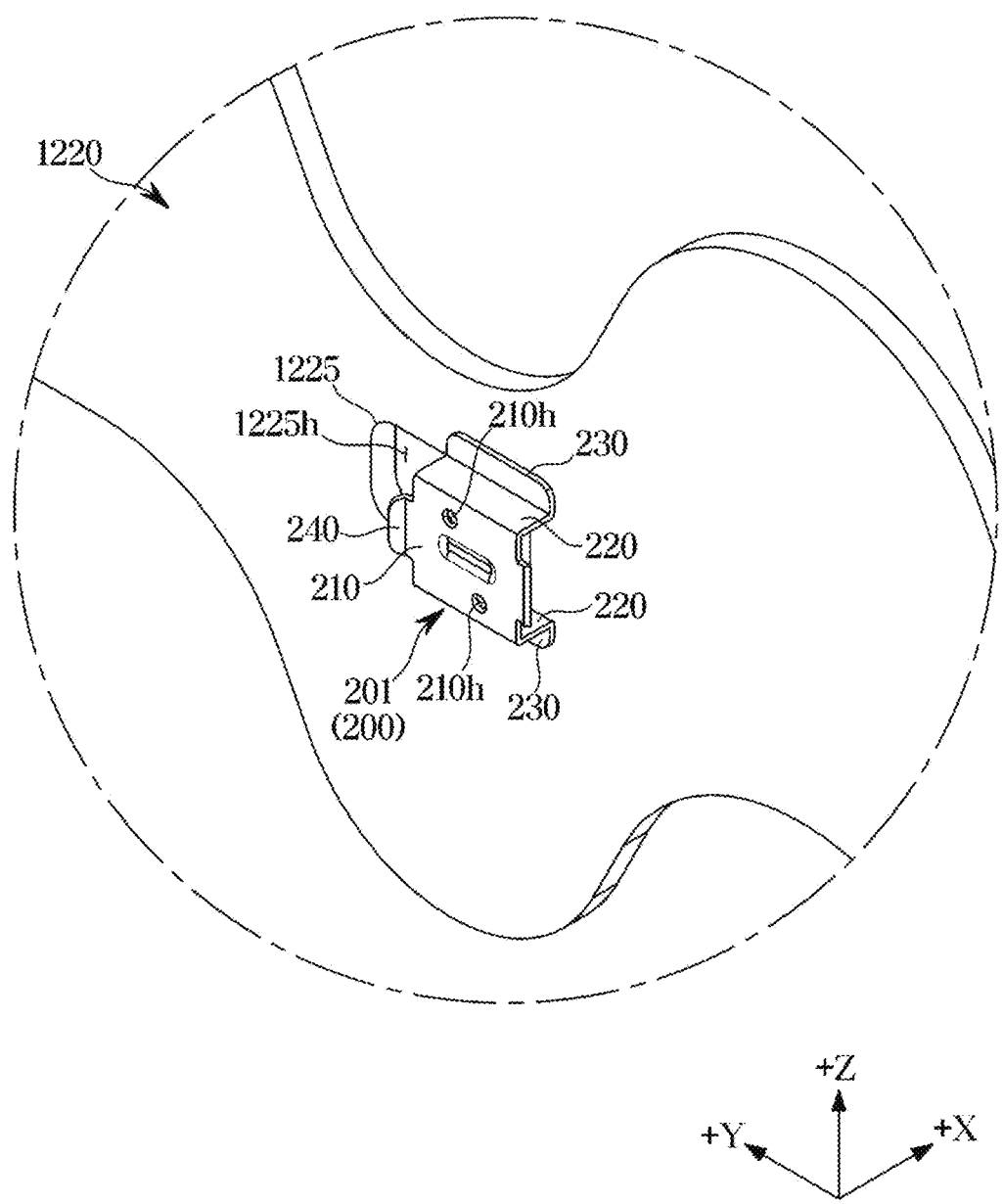
FIG. 10 is a view illustrating the board bar and the bar fixer coupled thereto of the display apparatus according to one or more embodiments.
Figure 11:
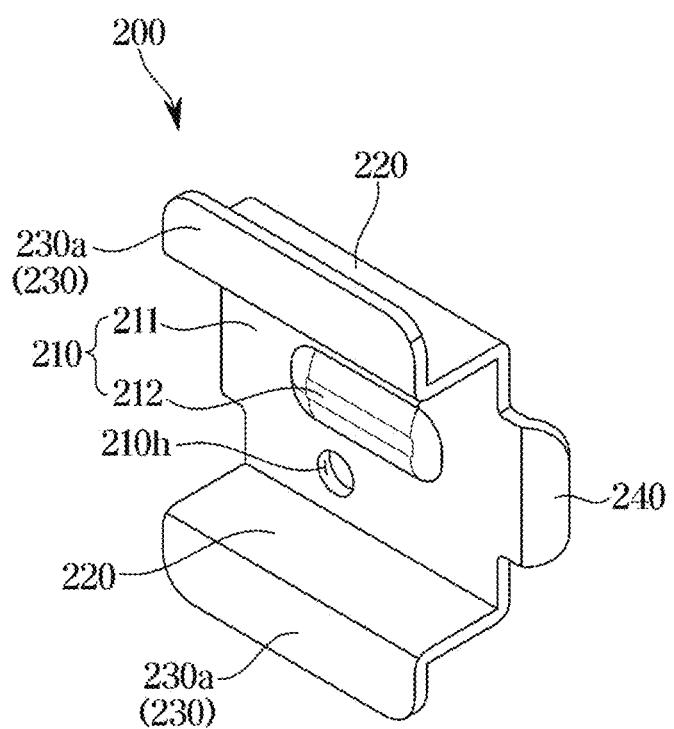
FIG. 11 is a view illustrating the bar fixer of the display apparatus according to one or more embodiments.
Figure 12:
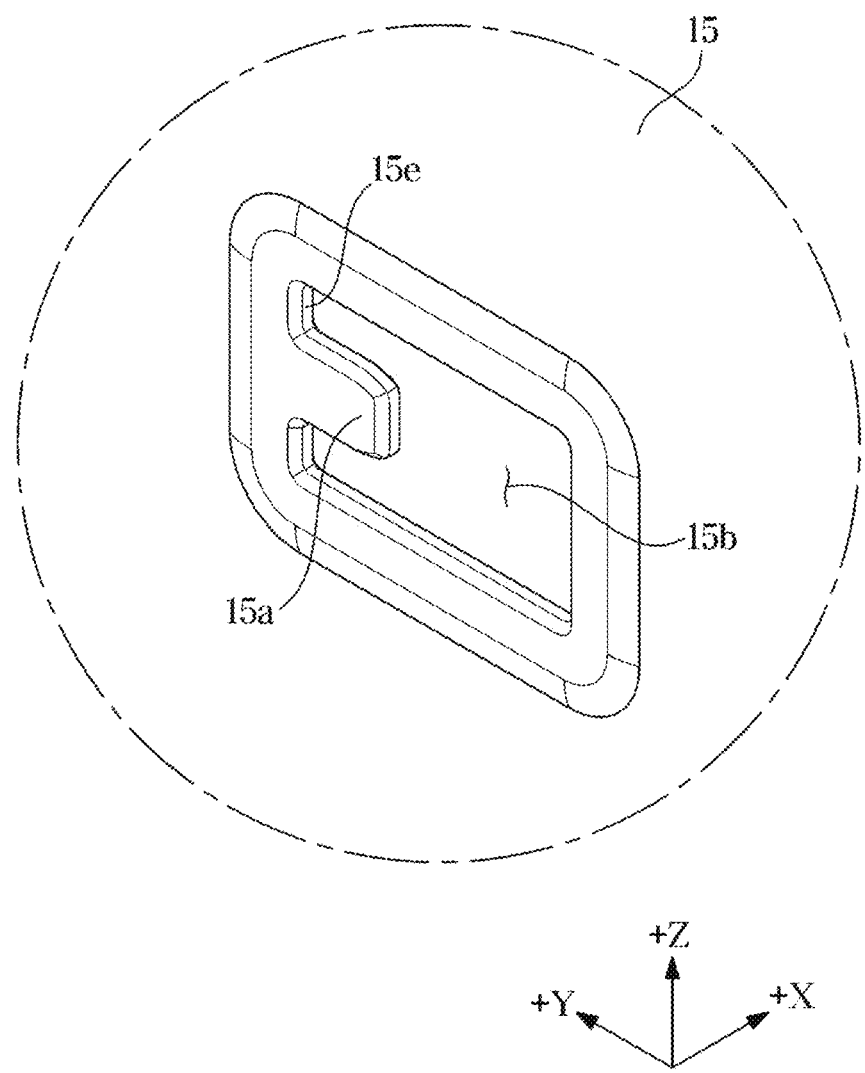
FIG. 12 is a view illustrating a mounting portion provided on the bottom chassis of the display apparatus according to one or more embodiments.

FIG. 10 is a view illustrating the board bar and the bar fixer coupled thereto of the display apparatus according to one or more embodiments. FIG. 11 is a view illustrating the bar fixer of the display apparatus according to one or more embodiments. FIG. 12 is a view illustrating a mounting portion provided on the bottom chassis of the display apparatus according to one or more embodiments.

Referring to FIGS. 10 to 12, the display apparatus 1 according to one or more embodiments may include the bar fixer 201 provided to fix the board bar 1220 to the bottom chassis 15. The bar fixer 201 may be provided to mount the board bar 1220 to the bottom chassis 15. The bar fixer 201 may be a type of board fixer 200 provided to mount the light source board 1200 to the bottom chassis 15. In other words, the board fixer 200 may include the bar fixer 201.

The bar fixer 201 may be mounted on the board bar 1220. The bar fixer 201 may be fixed to the board bar 1220. The bar fixer 201 may be coupled to the coupling portion 1225 of the board bar 1220.

According to one or more embodiments, the bar fixer 201 may include a board coupling portion 230 coupled to the board bar 1220. The bar fixer 201 may be fixed to the board bar 1220 through the board coupling portion 230. The bar fixer 201 may be supported on the board bar 1220 through the board coupling portion 230. The board coupling portion 230 may be in contact with the board bar 1220.

According to one or more embodiments, the bar fixer 201 may be fixed to the board bar 1220 by solder that couples the board coupling portion 230 to the board bar 1220. Alternatively, the bar fixer 201 may be fixed to the board bar 1220 by an adhesive that couples the board coupling portion 230 to the board bar 1220. However, the present disclosure is not limited thereto, and the bar fixer 201 may be coupled to the board bar 1220 in various ways. According to one or more embodiments, the bar fixer 201 may be coupled to the board bar 1220 by a fastening member such as a pin or screw that penetrates the board coupling portion 230.

According to one or more embodiments, the board coupling portion 230 may include a contact surface 230a provided to be in contact with one surface of the board bar 1220. The contact surface 230a may have a shape corresponding to one surface of the board bar 1220. According to one or more embodiments, the contact surface 230a may be formed in a planar shape. In this case, the bar fixer 201 may be fixed to the board bar 1220 by solder, adhesive, etc. disposed between the contact surface 230a and one surface of the board bar 1220.

According to one or more embodiments, on one side of the board bar 1220 facing the bottom chassis 15, the bar fixer 201 may be provided to mount the board bar 1220 to the bottom chassis 15. In other words, at the rear of the board bar 1220, the bar fixer 201 may be provided to mount the board bar 1220 to the bottom chassis 15.

According to one or more embodiments, the bar fixer 201 may be provided on one side of the board bar 1220 facing the bottom chassis 15. Particularly, the bar fixer 201 may be coupled to one surface of the board bar 1220 facing the bottom chassis 15. The bar fixer 201 may be coupled to the rear surface of the board bar 1220. The above-described board coupling portion 230 may be coupled to one surface of the board bar 1220 facing the bottom chassis 15.

According to one or more embodiments, the board bar 1220 may be composed of a single-sided PCB on which a circuit pattern is formed only on the front surface, on which the light source 1100 is mounted, among both sides in the front and rear direction X. At this time, by using various coupling methods such as solder and adhesive, the bar fixer 201 may be coupled to the rear surface of the board bar 1220 facing the bottom chassis 15.

Alternatively, the board bar 1220 may be composed of a double-sided PCB with circuit patterns formed on both sides in the front and rear direction X. At this time, by using various coupling methods such as solder, adhesive, or a separate PCB mounting structure, the bar fixer 201 may be coupled to the rear surface of the board bar 1220 facing the bottom chassis 15.

According to one or more embodiments, the bar fixer 201 may include a plurality of board coupling portions 230. Particularly, as shown in FIGS. 10 and 11, the bar fixer 201 may include a pair of board coupling portions 230. The pair of board coupling portions 230 may each be coupled to the board bar 1220. Particularly, at positions spaced apart from each other, the pair of board coupling portions 230 may be coupled to one surface of each of the board bar 1220.

According to one or more embodiments, the pair of board coupling portions 230 may be disposed to face each other with respect to a direction different from a direction, in which the bar fixer 201 is mounted on the mounting portion 15a of the bottom chassis 15 (e.g., a direction in which the bar fixer 201 slides with respect to the mounting portion 15a while being mounted to the mounting portion 15a, as described later). According to one or more embodiments shown in FIG. 10, the pair of board coupling portions 230 may be arranged to face each other with respect to the first direction Z.

According to one or more embodiments, the pair of board coupling portions 230 may be arranged symmetrically with respect to the center of the bar fixer 201. According to one or more embodiments, the pair of board coupling portions 230 may be disposed symmetrically with respect to a center line passing through the center of the bar fixer 201 in a direction in parallel with the direction in which the bar fixer 201 is mounted on the mounting portion 15a of the bottom chassis 15. According to one or more embodiments shown in FIG. 10, the pair of board coupling portions 230 may be arranged symmetrically with respect to the center line passing through the center of the bar fixer 201 in the second direction Y.

Accordingly, by including the plurality of board coupling portions 230, the bar fixer 201 may be more firmly fixed to the board bar 1220 and may be more stably supported by the board bar 1220. The number of board coupling portions 230 is not limited to the number shown in FIGS. 10 and 11, and various numbers of board coupling portions 230 may be provided in a single bar fixer 201.

Alternatively, the bar fixer 201 may be coupled to the board bar 1220 through various structures.

The bar fixer 201 may fix the board bar 1220 and the bottom chassis 15 by being mounted on the bottom chassis 15. The bar fixer 201 may fix the board bar 1220 and the bottom chassis 15 by being coupled to the bottom chassis 15.

Particularly, as described above, the bottom chassis 15 may include the mounting portion 15a on which the bar fixer 201 is mounted. When the bar fixer 201 is mounted on the mounting portion 15a, the bar fixer 201 may be in contact with one surface of the mounting portion 15a.

The bar fixer 201 may include a fixing body 210 provided to be in contact with the bottom chassis 15. According to one or more embodiments, the fixing body 210 may be in contact with one surface of the bottom chassis 15 opposite to the board bar 1220. In other words, the fixing body 210 may be in contact with the rear surface of the bottom chassis 15. At this time, the front surface of the bottom chassis 15 may be in contact with the board bar 1220, and the rear surface of the bottom chassis 15 may be in contact with the fixing body 210. With this structure, the bottom chassis 15 may be in contact with both configurations simultaneously while a portion of the bottom chassis 15 is disposed between the board bar 1220 and the fixing body 210. Accordingly, the board bar 1220 may be fixed to the bottom chassis 15.

That is, the fixing body 210 may be provided to be in contact with the mounting portion 15a. According to one or more embodiments, the fixing body 210 may be provided to be in contact with one surface, which is opposite to the board bar 1220, of the mounting portion 15a. The fixing body 210 may be in contact with the rear of the bottom chassis 15.

One surface of the fixing body 210 in contact with the mounting portion 15a of the bottom chassis 15 may be arranged to face the board bar 1220.

According to one or more embodiments, the fixing body 210 may be provided to allow one surface in contact with the mounting portion 15a of the bottom chassis 15 to be parallel with the board bar 1220. According to one or more embodiments, the fixing body 210 may be provided to allow one surface in contact with the mounting portion 15a of the bottom chassis 15 to be parallel with the mounting portion 15a.

Particularly, the fixing body 210 may include a cover portion 211 provided to cover one surface of the bottom chassis 15 opposite to the board bar 1220, and an interference protrusion 212 protruding from the cover portion 211.

The cover portion 211 may be provided to cover the rear surface of the bottom chassis 15. When the bar fixer 201 is mounted on the mounting portion 15a, the cover portion 211 may cover the rear surface of the mounting portion 15a opposite to the front surface facing the board bar 1220.

According to one or more embodiments, the cover portion 211 may be provided to be parallel with one surface of the mounting portion 15a. According to one or more embodiments, the cover portion 211 may be formed to have a substantially flat plate shape.

The interference protrusion 212 may be provided to be in contact with the mounting portion 15a in a state in which the bar fixer 201 is mounted on the mounting portion 15a. The interference protrusion 212 may be provided to interfere with the mounting portion 15a in the state in which the bar fixer 201 is mounted on the mounting portion 15a. In the state in which the bar fixer 201 is mounted on the mounting portion 15a, the interference protrusion 212 may be provided to press the mounting portion 15a to the direction in which the board bar 1220 is located.

According to one or more embodiments, the interference protrusion 212 may protrude from the cover portion 211 toward the rear surface of the bottom chassis 15. In other words, the interference protrusion 212 may protrude from the cover portion 211 toward the mounting portion 15a. In other words, the interference protrusion 212 may protrude from the cover portion 211 toward the board bar 1220. Based on the one or more embodiments shown in FIGS. 10 and 11, the interference protrusion 212 may protrude from the cover portion 211 toward the front (+X direction).

By the interference protrusion 212, the bar fixer 201 may be more firmly mounted on the mounting portion 15a of the bottom chassis 15. Accordingly, the bar fixer 201 and the board bar 1220 may be more stably fixed to the bottom chassis 15.

However, the structure of the fixing body 210 is not limited thereto, and the fixing body 210 may include various structure provided to be in contact with the mounting portion 15a of the bottom chassis 15 to allow the board bar 1220 to be fixed to the bottom chassis 15.

In order that the fixing body 210 is in contact with the rear surface of the mounting portion 15a so as to be mounted thereon, the bottom chassis 15 may include a chassis hole 15b. The chassis hole 15b may be formed to be penetrated by the bar fixer 201. The bar fixer 201 may be disposed through the chassis hole 15b. According to one or more embodiments, the chassis hole 15b may be formed in the shape of a hole formed as the board bar 1220 is penetrated in the front and rear direction X.

According to one or more embodiments, the chassis hole 15b may have a substantially quadrangle shape as shown in the drawing, but the shape thereof is not limited thereto.

The board bar 1220 disposed on one side of the bottom chassis 15 with respect to the chassis hole 15b may be in contact with one surface of the bottom chassis 15, and the board bar 1220 disposed on the other side of the bottom chassis 15 with respect to the chassis hole 15b may be in contact with the other surface of the bottom chassis 15. With this structure, the bar fixer 201 and the board bar 1220 may be mounted on the bottom chassis 15.

Particularly, the mounting portion 15a may be provided in the chassis hole 15b. The mounting portion 15a may be located inside the chassis hole 15b. For example, the mounting portion 15a may extend from one side of an edge 15e of the chassis hole 15b toward the inside of an edge of the chassis hole 15b.

The mounting portion 15a may extend in one direction from one side of the edge 15e of the chassis hole 15b. The one direction, in which the mounting portion 15a extends, may be parallel with the direction in which the bar fixer 201 is mounted on the mounting portion 15a (e.g., a direction in which the bar fixer 201 slides with respect to the mounting portion 15a when the bar fixer 201 is mounted to the mounting portion 15a, as described later). Particularly, the mounting portion 15a may extend from one side of the edge 15e of the chassis hole 15b to a direction opposite to the direction in which the bar fixer 201 is mounted on the mounting portion 15a. According to one or more embodiments shown in FIG. 12, the mounting portion 15a may extend in the second direction Y from one side of the edge 15e of the chassis hole 15b.

The bar fixer 201 may include an extending portion 220. The extending portion 220 may be connected to the fixing body 210. The extending portion 220 may extend from the fixing body 210.

Particularly, the extending portion 220 may extend from the fixing body 210 toward the board bar 1220. According to one or more embodiments, the extending portion 220 may connect the fixing body 210 and the board coupling portion 230. The extending portion 220 may extend from the fixing body 210 to the board coupling portion 230.

According to one or more embodiments, the extending portion 220 may extend in a different direction from the fixing body 210. According to one or more embodiments, the extending portion 220 may extend in a different direction from the board coupling portion 230. According to one or more embodiments shown in FIGS. 10 and 11, the extending portion 220 may extend approximately along the front and rear direction X, and the extending portion 220 may extend from the fixing body 210 to the front (+X direction).

The extending portion 220 may be provided to penetrate the chassis hole 15b. Particularly, the extending portion 220 may extend from the fixing body 210 to penetrate the chassis hole 15b. The extending portion 220 may extend from the fixing body 210 toward the board bar 1220 by passing through the chassis hole 15b.

By the extending portion 220, the fixing body 210 and the board bar 1220 may be arranged to be spaced apart from each other. Particularly, the rear surface of the board bar 1220 and the fixing body 210 may be arranged to face each other at a spaced apart position by the extending portion 220. Accordingly, a space may be formed between the board bar 1220 and the fixing body 210. When the bar fixer 201 is mounted on the mounting portion 15a, the mounting portion 15a may be disposed in the space between the board bar 1220 and the fixing body 210.

In other words, when the bar fixer 201 is mounted on the mounting portion 15a, the fixing body 210 and the extending portion 220 may be arranged to surround at least a portion of the mounting portion 15a.

With this structure, the bar fixer 201 may be more stably mounted on the mounting portion 15a. In addition, with this structure, the bar fixer 201 and the board bar 1220 may be more stably fixed to the bottom chassis 15.

According to one or more embodiments, the bar fixer 201 may include a plurality of extending portions 220. Particularly, as shown in FIGS. 10 and 11, the bar fixer 201 may include a pair of extending portions 220. The pair of extending portions 220 may each be connected to the fixing body 210. The pair of extending portions 220 may be respectively connected to the fixing body 210 at positions spaced apart from each other.

According to one or more embodiments, the pair of extending portions 220 may be disposed to face each other in a direction different from the direction in which the bar fixer 201 is mounted on the mounting portion 15a (e.g., a direction in which the bar fixer 201 slides with respect to the mounting portion 15a when the bar fixer 201 is mounted to the mounting portion 15a, as described later). According to one or more embodiments shown in FIG. 10, the pair of extending portions 220 may be arranged to face each other in the first direction Z. According to one or more embodiments shown in FIG. 10, the pair of extending portions 220 may each extend from both sides of the fixing body 210, which is in the first direction Z, toward the board bar 1220.

According to one or more embodiments, each extending portion of the pair of extending portions 220 may extend along the direction in which the bar fixer 201 is mounted on the mounting portion 15a of the bottom chassis 15.

According to one or more embodiments, the pair of extending portions 220 may be arranged symmetrically with respect to the center of the bar fixer 201. According to one or more embodiments, the pair of extending portions 220 may be arranged symmetrically to each other with respect to a center line passing through the bar fixer 201 in the direction in parallel with the direction in which the bar fixer 201 is mounted on the mounting portion 15a of the bottom chassis 15. According to one or more embodiments shown in FIG. 10, the pair of extending portions 220 may be arranged symmetrically with respect to the center line passing through the center of the bar fixer 201 in the second direction Y.

Accordingly, the bar fixer 201 may be supported more stably on the board bar 1220 by including the plurality of extending portions 220. In addition, the bar fixer 201 may be more stably mounted on the mounting portion 15a by including the plurality of extending portions 220. The number of extending portions 220 is not limited to the number shown in FIGS. 10 and 11, and a various number of extending portions 220 may be provided in a single bar fixer 201.

With the above-mentioned structure, the bar fixer 201 may be stably mounted on the mounting portion 15a of the bottom chassis 15, and the board bar 1220 may be stably fixed to the bottom chassis 15 by using the bar fixer 201.

The above-mentioned each configuration of the bar fixer 201 may be provided to be symmetrical with respect to the center of the bar fixer 201. According to one or more embodiments, the above-mentioned each configuration of the bar fixer 201 may be provided to be symmetrical with respect to the center line passing through the center of the bar fixer 201 in the first direction Z. Alternatively, the above-mentioned each configuration of the bar fixer 201 may be provided to be symmetrical with respect to the center line passing through the center of the bar fixer 201 in the second direction Y. The bar fixer 201 may be provided to have a structure symmetrical about the center, and thus when manufacturing, in which the bar fixer 201 is fixed to the board bar 1220, is performed, a restriction due to the direction of the bar fixer 201 about the board bar 1220 may be reduced and a manufacturer performing this work may have little consideration for the direction of the bar fixer 201. Work efficiency for coupling the bar fixer 201 to the board bar 1220 may be improved and thus manufacturing time and manufacturing costs may be reduced.

Figure 13:
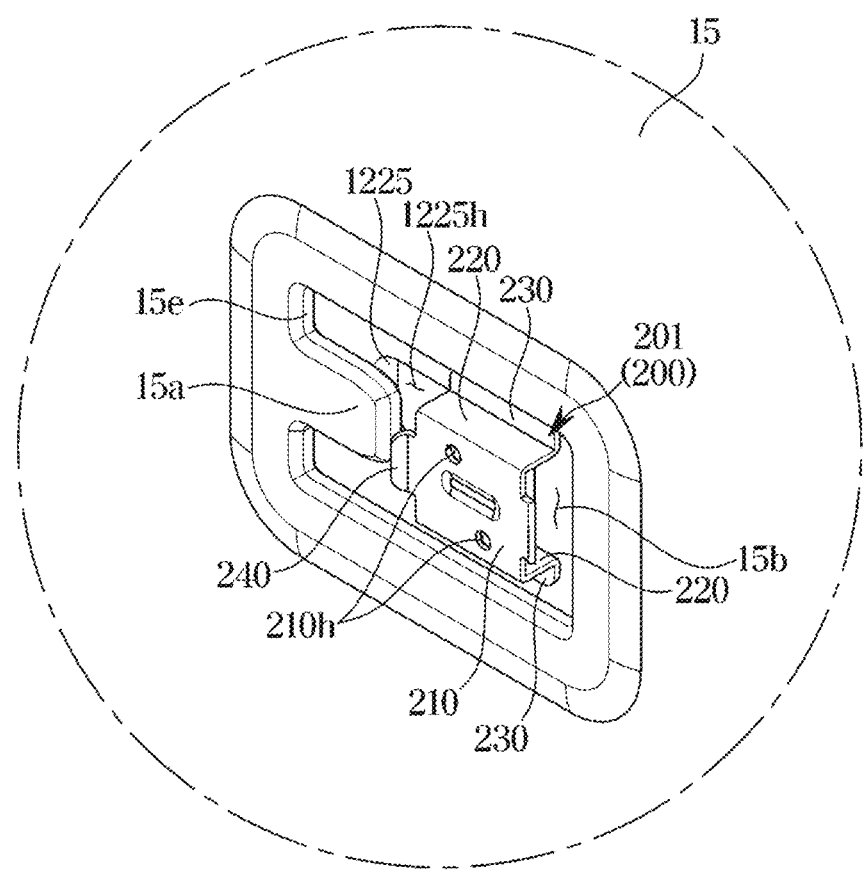
FIG. 13 is a view illustrating a state before the light source board of the display apparatus is mounted on the bottom chassis one or more embodiments.
Figure 14:
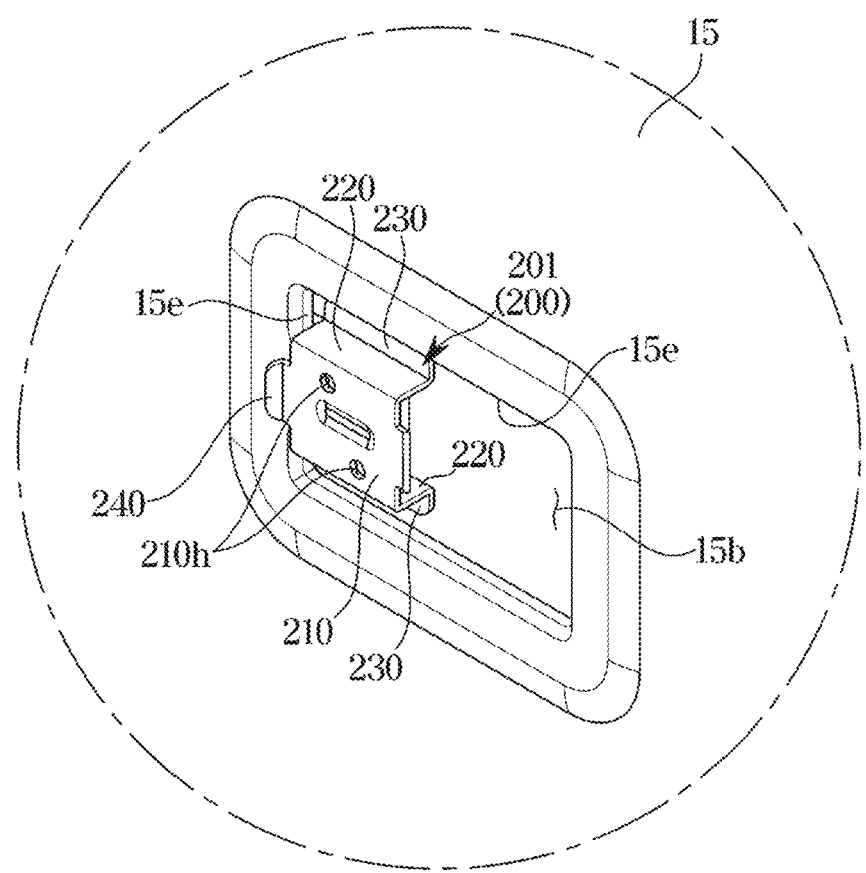
FIG. 14 is a view illustrating a state after the light source board of the display apparatus is mounted on the bottom chassis one or more embodiments.
Figure 15:
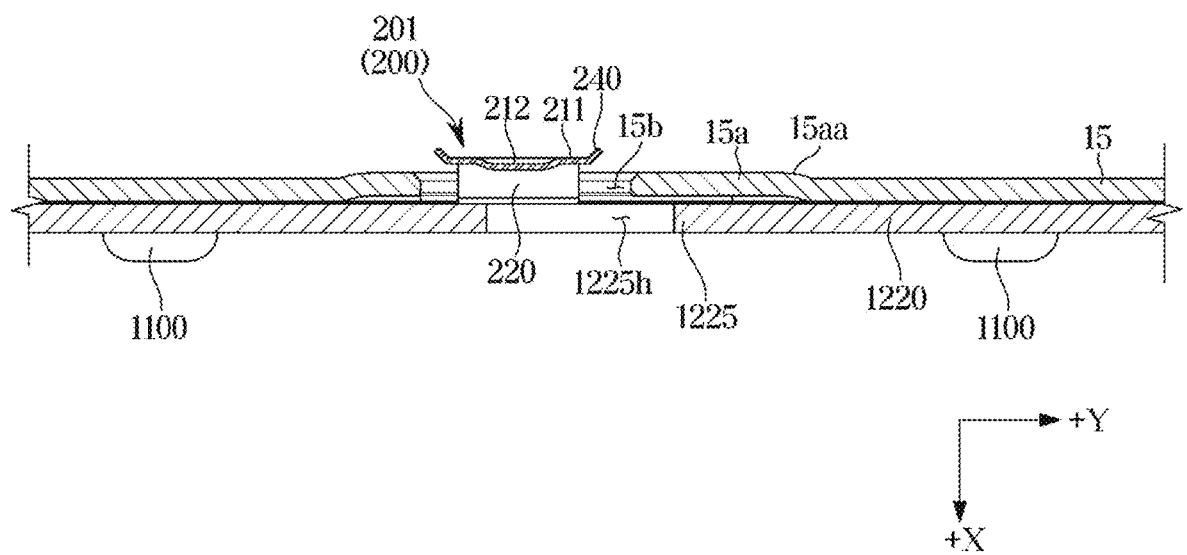
FIG. 15 is a view illustrating the state before the light source board of the display apparatus is mounted on the bottom chassis one or more embodiments.
Figure 16:
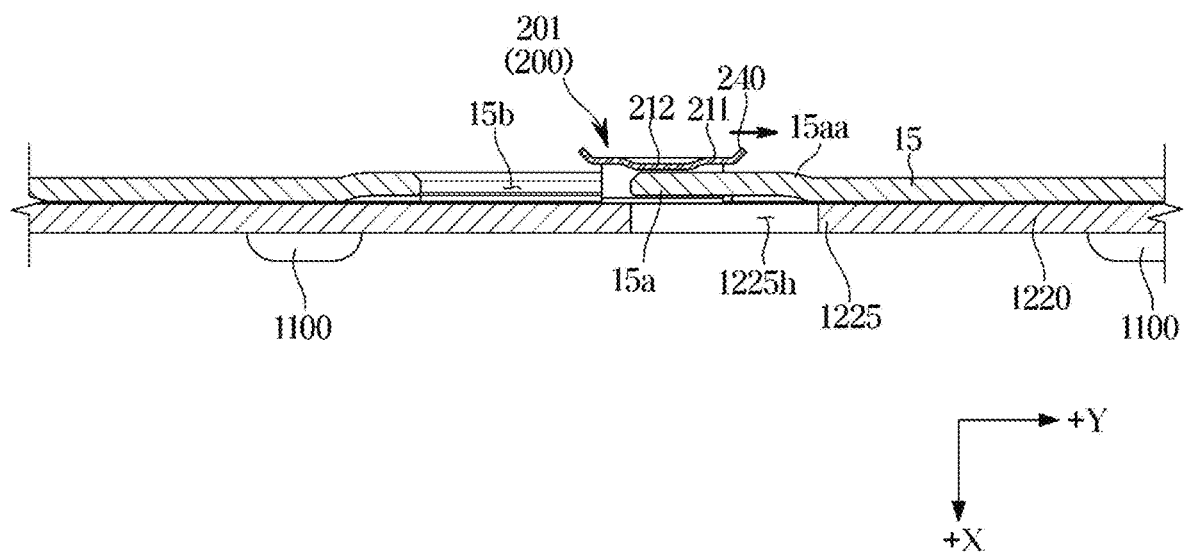
FIG. 16 is a view illustrating the state after the light source board of the display apparatus is mounted on the bottom chassis one or more embodiments.

FIG. 13 is a view illustrating a state before the light source board of the display apparatus is mounted on the bottom chassis according to one or more embodiments. FIG. 14 is a view illustrating a state after the light source board of the display apparatus is mounted on the bottom chassis according to one or more embodiments. FIG. 15 is a view illustrating the state before the light source board of the display apparatus is mounted on the bottom chassis according to one or more embodiments. FIG. 16 is a view illustrating the state after the light source board of the display apparatus is mounted on the bottom chassis according to one or more embodiments.

Referring to FIGS. 13 to 16, in the display apparatus 1 according to one or more embodiments, the light source board 1200 may be mounted on the bottom chassis 15 by sliding with respect to the bottom chassis 15.

Particularly, the bar fixer 201 coupled to the board bar 1220 may be arranged to slide in one direction with respect to the bottom chassis 15 and be mounted on the bottom chassis 15. The bar fixer 201 may be provided to be mounted on the mounting portion 15a by sliding in one direction with respect to the mounting portion 15a.

Referring to FIGS. 13 and 15, at a position before the bar fixer 201 is mounted on the mounting portion 15a, the bar fixer 201 may be arranged to penetrate the chassis hole 15b. At this time, the extending portion 220 of the bar fixer 201 may be arranged to penetrate the chassis hole 15b, and the board bar 1220 may be located in front of the chassis hole 15b (+X direction), and the fixing body 210 may be located at the rear (−X direction) of the chassis hole 15b.

Thereafter, as shown in FIGS. 14 and 16, as the bar fixer 201 moves in one direction with respect to the mounting portion 15a and approaches the mounting portion 15a, the fixing body 210 may be in contact with the rear surface of the mounting portion 15a. Particularly, as the bar fixer 201 moves in one direction with respect to the mounting portion 15a and approaches the mounting portion 15a, the interference protrusion 212 of the fixing body 210 may press the mounting portion 15a. At this time, the board bar 1220 may be in contact with the front surface of the bottom chassis 15, and the fixing body 210 may be in contact with the rear surface of the bottom chassis 15. Further, the fixing body 210 and the extending portion 220 may be arranged to surround at least a portion of the mounting portion 15a. Accordingly, the bar fixer 201 may be mounted on the mounting portion 15a, and the board bar 1220 may be fixed to the bottom chassis 15.

According to one or more embodiments, the mounting portion 15a may include a fixed end 15aa connected to another portion of the bottom chassis 15. At this time, the fixed end 15aa of the mounting portion 15a may extend in a direction inclined toward the rear (−X direction) that is opposite to a direction, in which the bottom chassis 15 faces the board body 1210, as extending from other portion of the bottom chassis 15 toward a direction facing the mounting portion 15a. By the fixed end 15aa, the mounting portion 15a may be located rearward (−X direction) than other portion of the bottom chassis 15 connected to the fixed end 15aa. When the bar fixer 201 is mounted on the mounting portion 15a, the fixing body 210 may be located at the rear of the mounting portion 15a. Accordingly, an extent, to which the fixing body 210 presses the mounting portion 15a, may further increase by the structure, and the bar fixer 201 may be more firmly mounted on the mounting portion 15a.

As illustrated in FIGS. 13 to 16, the bar fixer 201 may include an inclined guide 240.

The inclined guide 240 may be provided at one end of the bar fixer 201 with respect to a direction in which the bar fixer 201 slides when the bar fixer 201 is mounted on the mounting portion 15a. The inclined guide 240 may guide the movement of the bar fixer 201 to allow the bar fixer 201 to be stably mounted on the mounting portion 15a when the bar fixer 201 slides in the direction in which the bar fixer 201 is mounted on the mounting portion 15a.

Particularly, the inclined guide 240 may be provided at an end of the fixing body 210 with respect to the sliding direction of the fixing body 210 (hereinafter referred to as 'one-directional end of the fixing body 210'). The inclined guide 240 may extend in a direction that is away from one surface of the bottom chassis 15 as being from the one-directional end of the fixing body 210 to the sliding movement direction of the fixing body 210. The inclined guide 240 may extend in an inclined direction with respect to the fixing body 210.

With this configuration, when the bar fixer 201 slides toward the mounting portion 15a, the inclined guide 240 may firstly reach the mounting portion 15a before the fixing body 210 reaches the mounting portion 15a. The movement of the bar fixer 201 relative to the mounting portion 15a may be guided due to the inclined structure of the inclined guide 240.

With this configuration, the process of mounting the board bar 1220 to the bottom chassis 15 may be performed more efficiently, and manufacturing time and manufacturing costs may be reduced.

Meanwhile, as shown in FIGS. 13 to 16, the above-mentioned structure of the inclined guide 240 of the bar fixer 201 may be provided to be symmetrical with respect to the center of the bar fixer 201. According to one or more embodiments, the above-mentioned structure of the inclined guide 240 may be provided to be symmetrical with respect to the center line passing through the center of the bar fixer 201 in the first direction Z. Alternatively, the above-mentioned structure of the inclined guide 240 may be provided to be symmetrical with respect to the center line passing through the center of the bar fixer 201 in the second direction Y. The inclined guide 240 may be provided to have a structure symmetrical with respect to the center of the bar fixer 201, and thus when a work, in which the bar fixer 201 is fixed to the board bar 1220, is performed, a restriction due to the direction of the bar fixer 201 about the board bar 1220 may be reduced and a manufacturer performing this work may have little consideration for the direction of the bar fixer 201. Work efficiency for coupling the bar fixer 201 to the board bar 1220 may be improved and thus manufacturing time and manufacturing costs may be reduced.

The bar fixer 201 may be removably mounted on the mounting portion 15a. In other words, the bar fixer 201 may be provided to be mountable on the mounting portion 15a and at the same time, the bar fixer 201 may be removable again from the mounting portion 15a in a state in which the bar fixer 210 is mounted on the mounting portion 15a. That is, while the bar fixer 201 is mounted on the mounting portion 15a, the bar fixer 201 may be separated from the mounting portion 15a by sliding in a direction away from the mounting portion 15a.

With this structure, the board bar 1220 may be mounted on the bottom chassis 15 by sliding with respect to the bottom chassis 15, and similarly, the light source board 1200 may be mounted on the bottom chassis 15 by sliding with respect to the bottom chassis 15. With this structure, the board bar 1220 mounted on the bottom chassis 15 may be separated from the bottom chassis 15 by sliding in a direction that is opposite to a direction in which the board bar 1220 is moved when being mounted.

In FIGS. 13 to 16, it is assumed that the board bar 1220 moves in the right direction (+Y direction) of the display apparatus 1 with respect to the bottom chassis 15 and is mounted on the bottom chassis 15, but is not limited thereto. According to one or more embodiments the board bar 1220 may move in the left direction (−Y direction) of the display apparatus 1 with respect to the bottom chassis 15 and be mounted on the bottom chassis 15. Alternatively, the board bar 1220 may move in the vertical direction (Z direction) with respect to the bottom chassis 15 and be mounted on the bottom chassis 15.

Figure 17:
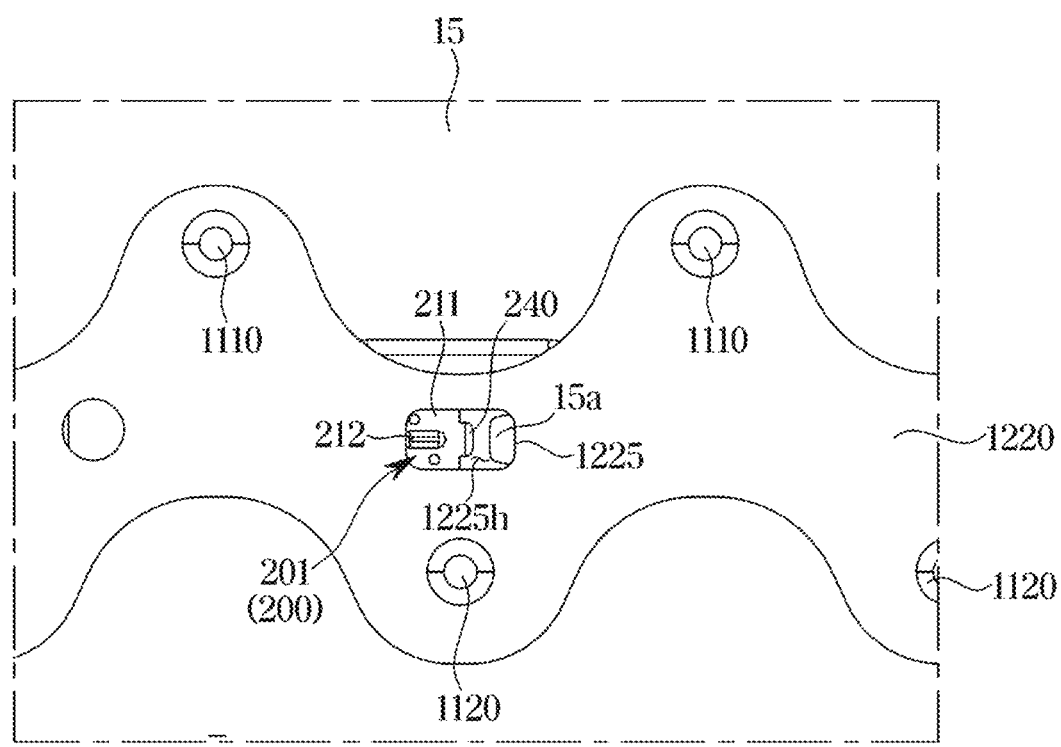
FIG. 17 is a view illustrating the state before the light source board of the display apparatus is mounted on the bottom chassis one or more embodiments.
Figure 18:
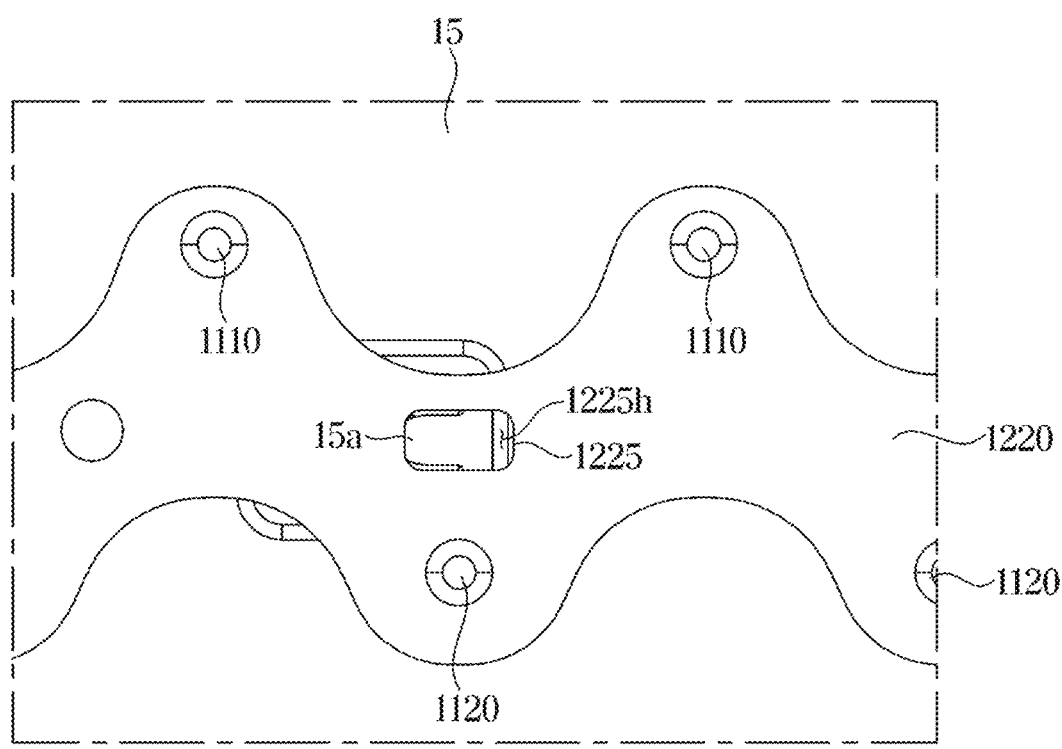
FIG. 18 is a view illustrating the state after the light source board of the display apparatus is mounted on the bottom chassis one or more embodiments.

FIG. 17 is a view illustrating the state before the light source board of the display apparatus is mounted on the bottom chassis according to one or more embodiments. FIG. 18 is a view illustrating the state after the light source board of the display apparatus is mounted on the bottom chassis according to one or more embodiments.

Referring to FIGS. 17 and 18, the coupling portion 1225 included in the display apparatus 1 according to one or more embodiments of the present disclosure may include the board hole 1225h.

The board hole 1225h may be formed in a shape through which the board bar 1220 is penetrated in the front and rear direction (X direction).

According to one or more embodiments, the coupling portion 1225 may be formed at a position corresponding to the mounting portion 15a of the bottom chassis 15. Particularly, the coupling portion 1225 may be positioned to correspond to the mounting portion 15a when the bar fixer 201 is mounted on the mounting portion 15a and the board bar 1220 is fixed to the bottom chassis 15. In other words, based on the bar fixer 201 being mounted on the mounting portion 15a, the position of the coupling portion 1225 may correspond to the position of the mounting portion 15a (refer to FIG. 18). Conversely, when the bar fixer 201 is separated from the mounting portion 15a, the positions of the coupling portion 1225 and the mounting portion 15a may be misaligned (refer to FIG. 17).

According to one or more embodiments, when the bar fixer 201 is mounted on the mounting portion 15a and the board bar 1220 is fixed to the bottom chassis 15, at least a portion of the mounting portion 15a may be located in parallel with the board hole 1225h on the rear side (−X direction) of the board hole 1225h (refer to FIG. 18).

According to one or more embodiments, even when the bar fixer 201 is in a position separated from the mounting portion 15a, a portion of the mounting portion 15a may be located in parallel with the board hole 1225h on the rear side (−X direction) of the board hole 1225h (refer to FIG. 17).

The board hole 1225h may be formed in a position corresponding to the mounting portion 15a of the bottom chassis 15, and thus in the process, in which the bar fixer 201 is mounted on the mounting portion 15a to mount the board bar 1220 to the bottom chassis 15, a manufacturer performing this process can confirm the position of the mounting portion 15a at the rear side of the board bar 1220, through the board hole 1225h. Accordingly, the manufacturer can more easily perform the task of mounting the bar fixer 201 to the mounting portion 15a.

According to one or more embodiments, at least a portion of the bar fixer 201 may be arranged in parallel with the board hole 1225h on the rear side (−X direction) of the board hole 1225h. Accordingly, a manufacturer can more easily perform the task of mounting the bar fixer 201 to the mounting portion 15a.

Meanwhile, as shown in FIGS. 10 to 14, the bar fixer 201 may further include a fixing body hole 210h formed in the fixing body 210. The fixing body hole 210h may be formed to penetrate the fixing body 210 in the front and rear direction (X). According to one or more embodiments, the fixing body hole 210h may be formed in the cover portion 211 of the fixing body 210.

In the process in which the board bar 1220 is mounted to the bottom chassis 15, the fixing body 210 may move in a direction to cover the mounting portion 15a when the bottom chassis 15 is viewed from the rear (−X direction). At this time, a portion of the mounting portion 15a covered by the fixing body 210 may be viewed through the fixing body hole 210h, and a manufacturer can estimate the position of the mounting portion 15a through the fixing body hole 210h. Accordingly, the manufacturer can more easily perform the task of mounting the bar fixer 201 to the mounting portion 15a.

According to one or more embodiments, the bar fixer 201 may include a plurality of fixing body holes 210h. According to one or more embodiments, as shown in FIGS. 10 to 14, the bar fixer 201 may include a pair of fixing body holes 210h.

According to one or more embodiments, the pair of fixing body holes 210h may be arranged symmetrically with respect to the center of the bar fixer 201. According to one or more embodiments, the pair of fixing body holes 210h may be arranged symmetrically to each other with respect to a center line passing through the center of the bar fixer 201 in a direction in parallel with the direction in which the bar fixer 201 is mounted on the mounting portion 15a of the bottom chassis 15. According to one or more embodiments shown in FIG. 10, the pair of fixing body holes 210h may be arranged symmetrically with respect to a center line passing through the center of the bar fixer 201 in the second direction Y.

According to one or more embodiments, the pair of fixing body holes 210h may be arranged symmetrically with respect to a center line passing through the center of the bar fixer 201 in a direction perpendicular to the direction in which the bar fixer 201 is mounted on the mounting portion 15a of the bottom chassis 15. According to one or more embodiments shown in FIG. 10, the pair of fixing body holes 210h may be arranged symmetrically with respect to the center line passing through the center of the bar fixer 201 in the first direction Z.

As mentioned above, the pair of fixing body holes 210h may be provided to have a symmetrical structure with respect to the center of the bar fixer 201, and thus when manufacturing, in which the bar fixer 201 is coupled to the board bar 1220, is performed, a restriction due to the direction of the bar fixer 201 about the board bar 1220 may be reduced and a manufacturer performing this work may have little consideration for the direction of the bar fixer 201. Work efficiency for coupling the bar fixer 201 to the board bar 1220 may be improved and thus manufacturing time and manufacturing costs may be reduced.

Figure 19:
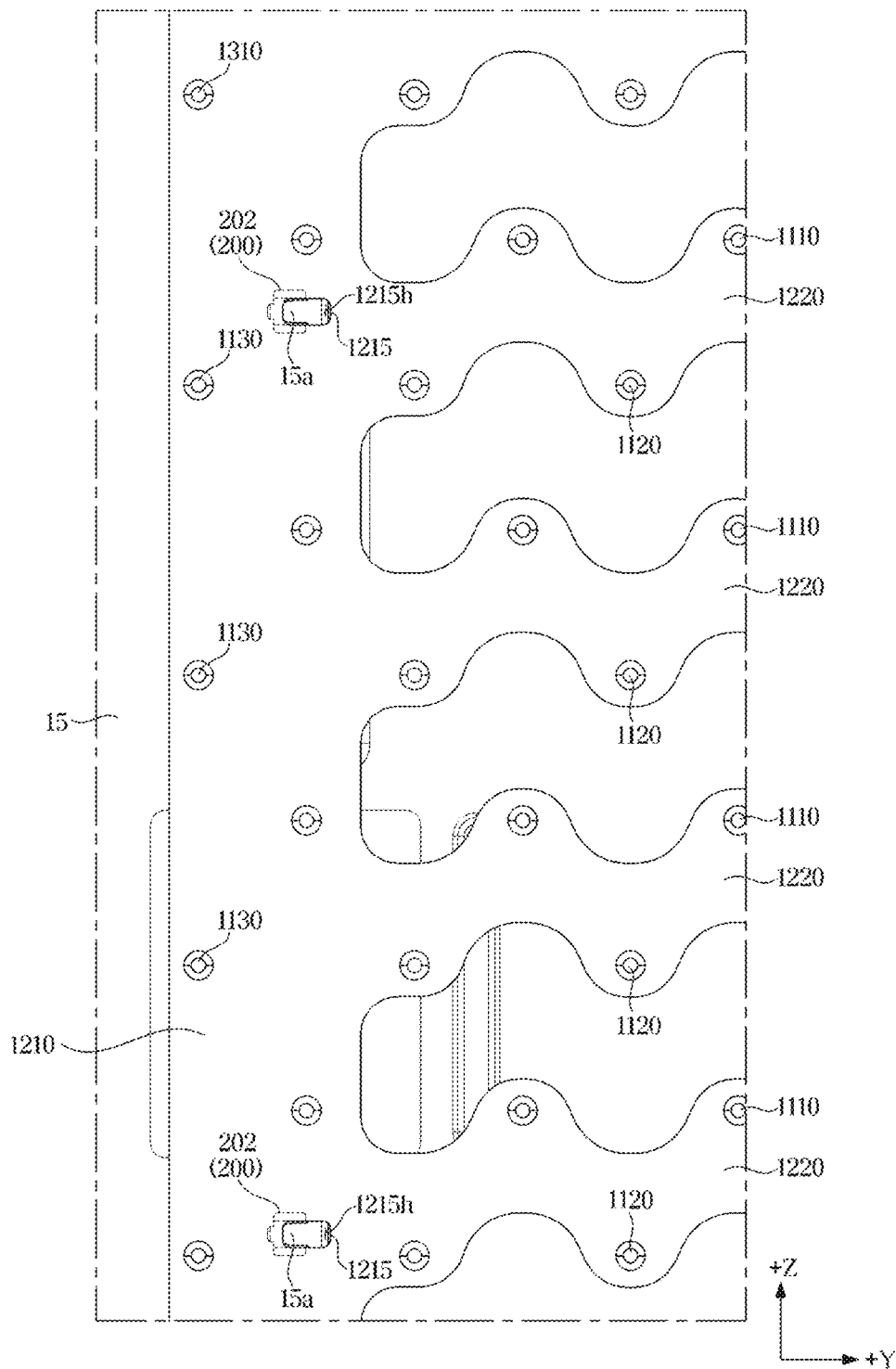
FIG. 19 is an enlarged view of a portion of the light source board and the bottom chassis of the display apparatus one or more embodiments.

FIG. 19 is an enlarged view of a portion of the light source board and the bottom chassis of the display apparatus according to one or more embodiments.

Referring to FIG. 19, the display apparatus 1 according to one or more embodiments of the present disclosure may include a body fixer 202. The body fixer 202 may be provided to fix the board body 1210 to the bottom chassis 15. The body fixer 202 may be provided on the board body 1210.

The body fixer 202 may be a type of board fixer 200 that mounts the light source board 1200 to the bottom chassis 15. The plurality of board fixers 200 may include the body fixer 202. That is, a portion of the plurality of board fixers 200 (i.e., body fixer 202) may be provided to fix the board body 1210 to the bottom chassis 15.

A single board body 1210 may be fixed to the bottom chassis 15 by one or more body fixers 202. A single board body 1210 may be mounted on the bottom chassis 15 by one or more body fixers 202.

The bottom chassis 15 may include a mounting portion 15a on which the body fixer 202 is mounted. The body fixer 202 may be provided to fix the board body 1210 to the bottom chassis 15 by being mounted on the mounting portion 15a. According to one or more embodiments, one body fixer 202 may be mounted on one mounting portion 15a.

According to one or more embodiments, the mounting portion 15a on which the body fixer 202 is mounted may have characteristics corresponding to the mounting portion 15a on which the bar fixer 201 is mounted. That is, the bottom chassis 15 may include a plurality of mounting portions 15a on which the plurality of board fixers 200, such as the bar fixer 201 and the body fixer 202, is mounted. According to one or more embodiments, a single board fixer 200 may be mounted on a single mounting portion 15a.

The board body 1210 may include a coupling portion 1215. The board body 1210 may be coupled to the bottom chassis 15 through the coupling portion 1215. The body fixer 202 may be disposed in the coupling portion 1215 of the board body 1210. To be distinguished from the above-described coupling portion (bar coupling portion) 1225 of the board bar 1220, the coupling portion 1215 of the board body 1210 may be referred to as 'body coupling portion 1215.'

According to one or more embodiments, the coupling portion 1215 of the board body 1210 may have a shape corresponding to the coupling portion 1225 of the board bar 1220. According to one or more embodiments, the coupling portion 1215 of the board body 1210 may include a board hole 1215h. The board hole 1215h may have characteristics corresponding to the board hole 1225h provided in the coupling portion 1215 of the board bar 1220.

According to one or more embodiments, one of the coupling portions 1215 provided on the board body 1210 and one of the coupling portions 1225 provided on the board bar 1220 may be arranged side by side in one direction. Particularly, as shown in FIG. 6, one of the coupling portions 1215 provided on the board body 1210 and one of the coupling portions 1225 provided on the board bar 1220 may be arranged side by side in the second direction Y.

Therefore, one body fixer 202 among the plurality of body fixers 202 and one bar fixer 201 among the plurality of bar fixers 201 may be arranged side by side in one direction. Particularly, as shown in FIG. 6, one body fixer 202 of the plurality of body fixers 202 and one bar fixer 201 of the plurality of bar fixers 201 may be arranged side by side in the second direction Y.

According to one or more embodiments, the board body 1210 may include the plurality of coupling portions 1215. According to one or more embodiments, the body fixer 202 may include the plurality of body fixers 202.

Particularly, the body fixer 202 may be coupled to each coupling portion 1215 of the board body 1210. That is, the number of coupling portions 1215 may correspond to the number of body fixers 202.

According to one or more embodiments, the plurality of coupling portions 1215 provided on a single board body 1210 may be arranged side by side in one direction. Particularly, as shown in FIG. 6, the plurality of coupling portions 1215 provided on a single board body 1210 may be arranged side by side in the first direction Z.

Therefore, the plurality of body fixers 202 disposed on a single board body 1210 may be arranged side by side in one direction. Particularly, as shown in FIG. 6, the plurality of body fixers 202 disposed on a single board body 1210 may be arranged side by side in the first direction Z.

As illustrated in FIG. 6, the number of body fixers 201 may be provided as less than or equal to the number of bar fixers 202. Therefore, the number of the plurality of coupling portions 1215 disposed on the board body 1210 may be provided as less than or equal to the number of coupling portions 1225 provided on the plurality of board bars 1220 connected to a single board body 1210.

In comparison with the board body 1210, each of the plurality of board bars 1220 needs to be more firmly fixed to the bottom chassis 15 due to the structure thereof, and further it is appropriate that each of the plurality of board bars 1220 is fixed to the bottom chassis 15 by the bar fixer 201. Therefore, when the number of the plurality of bar fixers 201 is greater than the number of the plurality of body fixers 202, each of the plurality of board bars 1220 may be stably fixed to the bottom chassis 15, and it is possible to prevent a case in which the number of body fixers 202 is less than or equal to the number of the plurality of bar fixers 201 and an unnecessarily large number of board fixers 200 is disposed on the plurality of body fixers 202.

According to one or more embodiments, the body fixer 202 may have the same structure as the bar fixer 201 described with reference to FIGS. 10 to 18. A detailed description of the structure, such as the shape, of the body fixer 202 will be omitted. However, the present disclosure is not limited thereto, and the body fixer 202 may have characteristics such as a shape different from that of the bar fixer 201 described above.

As described above, by sliding with respect to the mounting portion 15a, the bar fixer 201 may be mounted on the mounting portion 15a or removed from the mounting portion 15a. In the same manner as the bar fixer 201, by sliding with respect to the mounting portion 15a, the body fixer 202 may be mounted on the mounting portion 15a or removed from the mounting portion 15a.

At this time, by sliding in the same direction with respect to the mounting portion 15a, the bar fixer 201 and the body fixer 202 may be mounted to the mounting portion 15a and by sliding in the same direction with respect to the mounting portion 15a, the bar fixer 201 and the body fixer 202 may be separated from the mounting portion 15a. In the drawing, according to one or more embodiments, in which the bar fixer 201 and the body fixer 202 are mounted on the mounting portion 15a as the bar fixer 201 and the body fixer 202 move in the right direction (+Y direction) with respect to the mounting portion 15a, and the bar fixer 201 and the body fixer 202 are separated from the mounting portion 15a as the bar fixer 201 and the body fixer 202 move in the left direction (−Y direction) with respect to the mounting portion 15a, is illustrated, but the sliding movement directions of the bar fixer 201 and the body fixer 202 are not limited thereto.

With this configuration, the light source board 1200 including the board bar 1220 and the board body 1210 may be stably fixed to the bottom chassis 15.

The display apparatus 1 according to one or more embodiments of the present disclosure may include the display panel 21, the plurality of light sources 1100 configured to emit light to the display panel, the plurality of board bars 1220 on which the plurality of light sources are mounted, the plurality of board bars being spaced apart from each other along the first direction and extending in the second direction different from the first direction, the bottom chassis 15 configured to support the plurality of board bars, and the plurality of bar fixers 201 configured to fix the plurality of board bars to the bottom chassis. Each of the plurality of board bars 1220 may include the central extending portion 1221 extending in a center of each of the plurality of board bars in the second direction, and a coupling portion located on the central extending portion of each of the plurality of board bars and located on one side in the first direction with respect to one light source among the plurality of light sources mounted on each of the plurality of board bars. Each of the plurality of bar fixers 201 may be disposed on the coupling portion 1225 of each corresponding board bar among the plurality of board bars.

The plurality of light sources 1100 mounted on the each of the plurality of board bars may be spaced apart in the first direction from the central extending portion 1221.

The plurality of light sources may include the plurality of first side light sources 1110 disposed on one side of the first direction (i.e. positive side of the Z direction) with respect to the central extending portion on each of the plurality of board bars, and the plurality of second side light sources 1120 disposed on another side of the first direction (i.e. negative side of the Z direction) with respect to the central extending portion on each of the plurality of board bars. Each of the plurality of board bars may include the power supply line 1230 configured to supply power to the plurality of light sources. The power supply line may include the first line 1231 arranged along the position in which the plurality of first side light sources are arranged, and the second power supply line 1232 arranged along the position in which the plurality of second side light sources are arranged. The coupling portion 1225 may be disposed between the first power supply line 1231 and the second power supply line 1232 so as to avoid the power supply line.

The each of the plurality of board bars may further include the first protrusion 1222a protruding from one side of the central extending portion in the first direction, and some of the plurality of light sources are mounted on the first protrusion, and the second protrusion 1222b protruding from another side, which is opposite to the one side of the central extending portion in the first direction, and other light sources of the plurality of light sources different from the some of the light sources are mounted on the second protrusion. The coupling portion may be parallel with either the extreme end portion 1222aa, which is in the first direction, of the first protrusion or the extreme end portion 1222bb, which is in the first direction, of the second protrusion, with respect to the first direction.

The plurality of bar fixers 201 may be provided on a rear side (−X direction) of the plurality of board bars 1220 facing the bottom chassis 15.

Each of the plurality of bar fixers 201 may include the fixing body 210 contacting a rear surface of the bottom chassis opposite to the plurality of board bars.

The bottom chassis 15 may include a plurality of chassis holes 15b configured to be penetrated by the plurality of bar fixers. The rear surface of the bottom chassis 15 may be in contact with the fixing body 210 located on the rear side with respect to the plurality of chassis holes. The front surface of the bottom chassis 15 may be in contact with each of the plurality of board bars 1220 on the front side of the front-rear direction with respect to the plurality of chassis holes.

The bottom chassis may further include the plurality of mounting portions 15a on which the plurality of bar fixers is mounted. Each of the plurality of mounting portions 15a may extend from one side of the edge 15e of each of the plurality of chassis holes toward the inside of each of the plurality of chassis holes.

Each of the plurality of bar fixers may further include the extending portion 220 extending from the fixing body toward the plurality of board bars and may be configured to penetrate the plurality of chassis holes.

The bottom chassis may include the plurality of mounting portions on which each of the plurality of bar fixers are mounted. Each of the plurality of fixing bodies 210 and each of the plurality of extending portions 220 may surround at least a portion of each of the plurality of mounting portions 15a.

Each of the plurality of fixing bodies may include the cover portion 211 configured to cover the rear surface of the bottom chassis, and the interference protrusion 212 protruding from the cover portion toward the rear surface of the bottom chassis configured to interfere with the bottom chassis.

The bottom chassis may further include the plurality of mounting portions 15a, the plurality of bar fixers being mounted to the plurality of mounting portions. Each of the plurality of coupling portions 1225 may include the board hole 1225h formed at the position corresponding to the plurality of mounting portions.

The plurality of bar fixers 201 may be configured to be slidably mounted, in one direction, on the bottom chassis 15. Each of the plurality of bar fixers 201 may include the fixing body 210 contacting the rear surface of the bottom chassis at a position mounted on the bottom chassis, and the inclined guide 240 extending in direction that is away from the rear surface of the bottom chassis, as being from the fixing body to the one direction.

The display apparatus 1 may further include the board body 1210 supported by the bottom chassis and connected plurality of board bars, and the body fixer 202 disposed on the board body and configured to fix the board body to the bottom chassis.

The body fixer may include the plurality of body fixers. The number of the plurality of body fixers 202 may be less than or equal to the number of the plurality of bar fixers 201.

The display apparatus 1 according to one or more embodiments of the present disclosure may include the display panel 20, the plurality of light sources 1100 configured to emit light to the display panel, the light source board 1200 on which the plurality of light sources are mounted, the bottom chassis 15 provided to support the light source board, and the plurality of board fixers 200 configured to fix the light source board to the bottom chassis. The light source board may include the board body 1210, and the plurality of board bars 1220 spaced apart from each other along a first direction and extending from the board body, in a second direction different from the first direction. At least some 201 of the plurality of board fixers 200 may be disposed at the center of each of the plurality of board bars in the first direction (width direction Z), and parallel with one light source 1100 among the plurality of light sources mounted on each of the board bars, in the first direction (width direction Z), and may be configured to fix the plurality of board bars 1220 to the bottom chassis 15.

Each of the plurality of board fixers 200 may include the extending portion 220 extending from the rear surface of the light source board facing the bottom chassis and configured to penetrate the bottom chassis, and the fixing body 210 connected to the extending portion and contacting a rear surface of the bottom chassis opposite to the light source board.

The at least some 201 of the plurality of board fixers may be disposed adjacent to the end of one board bar of the plurality of board bars.

Other board fixers 202 of the plurality of board fixers, different from the at least some of the board fixers, may be disposed on the board body and provided to fix the board body to the bottom chassis.

The display apparatus 1 according to one or more embodiments of the present disclosure may include the plurality of light sources 1100, the plurality of board bars 1220 at least some of the plurality of light sources mounted thereon, the plurality of board bars arranged in the first direction, the bottom chassis 15 provided to support the plurality of board bars, and the plurality of bar fixers 201 provided to fix the plurality of board bars to the bottom chassis. Each of the plurality of board bars 1220 may include the central extending portion 1221 extending in the second direction perpendicular to the first direction, the plurality of first protrusions 1222a protruding upward in the first direction from the central extending portion, and the plurality of second protrusions 1222b protruding downward in the first direction from the central extending portion. Each of the plurality of bar fixers 201 may be arranged at the central extending portion of each of the plurality of board bars and be parallel with one of the plurality of first protrusions 1222a or the plurality of second protrusions 1222b with respect to the first direction Z.

As is apparent from the above description, a display apparatus may include a plurality of board fixers provided to fix a light source board to a bottom chassis, and thus the light source board may be efficiently fixed to the bottom chassis.

Further, a display apparatus may include a plurality of board fixers provided to stably fix a light source board to a bottom chassis, and thus durability and performance of the product may be improved.

Further, a display apparatus may include a mounting structure provided to efficiently mount a light source board to a bottom chassis, and thus product manufacturing efficiency may be improved and product manufacturing cost may be reduced.

Further, a display apparatus may include a mounting structure provided to efficiently mount a light source board to a bottom chassis and separate the light source board from the bottom chassis, thereby facilitating repair or replacement of parts of the light source board.

Further, a light source board included in a display apparatus may be provided with a coupling portion for coupling a bar fixer to a board bar, and the coupling portion may be located on a central extending portion of the board bar and disposed on one side in a width direction with respect to one light source among a plurality of light sources mounted on the board bar. Therefore, it is possible to prevent the coupling portion from interfering with a power supply line of the light source board.

While the disclosure has been illustrated and described with reference to one or more embodiments, it will be understood that the one or more embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiments described herein may be used in conjunction with any other embodiments described herein.

What is claimed is:

1. A display apparatus comprising:
   a display panel;
   a plurality of light sources configured to emit light to the display panel;
   a plurality of board bars on which the plurality of light sources are mounted, the plurality of board bars being spaced apart from each other along a first direction and extending in a second direction different from the first direction;
   a bottom chassis configured to support the plurality of board bars; and
   a plurality of bar fixers configured to fix the plurality of board bars to the bottom chassis,
   wherein each of the plurality of board bars comprises:
      a central extending portion extending in a center of each of the plurality of board bars in the second direction; and
      a coupling portion located on the central extending portion of each of the plurality of board bars and located on one side in the first direction with respect to one light source among the plurality of light sources mounted on each of the plurality of board bars, and
   wherein each of the plurality of bar fixers are disposed on the coupling portion of each corresponding board bar among the plurality of board bars,
   wherein the plurality of light sources comprise:
      a plurality of first side light sources disposed on one side of the first direction with respect to the central extending portion on each of the plurality of board bars; and a plurality of second side light sources disposed on another side of the first direction with respect to the central extending portion on each of the plurality of board bars,
   wherein each of the plurality of board bars comprises a power supply line configured to supply power to the plurality of light sources,
   wherein the power supply line comprises:
      a first power supply line arranged along a position in which the plurality of first side light sources are arranged; and
      a second power supply line arranged along a position in which the plurality of second side light sources are arranged, and
   wherein the coupling portion is disposed between the first power supply line and the second power supply line.

2. The display apparatus of claim 1, wherein the plurality of light sources mounted on each of the plurality of board bars are spaced apart in the first direction from the central extending portion.

3. The display apparatus of claim 1, wherein each of the plurality of board bars further comprises:
   a first protrusion protruding from one side of the central extending portion in the first direction, and some of the plurality of light sources being mounted on the first protrusion; and
   a second protrusion protruding from another side, which is opposite to the one side, of the central extending portion in the first direction, and other light sources of the plurality of light sources different from the some of the light sources being mounted on the second protrusion,
   wherein the coupling portion is parallel with either an extreme end portion, which is in the first direction, of the first protrusion or an extreme end portion, which is in the first direction, of the second protrusion, with respect to the first direction.

4. The display apparatus of claim 1, wherein the plurality of bar fixers are on a rear side of the plurality of board bars facing the bottom chassis.

5. The display apparatus of claim 4, wherein each of the plurality of bar fixers comprises a fixing body contacting a rear surface of the bottom chassis opposite to the plurality of board bars.

6. The display apparatus of claim 5, wherein the bottom chassis comprises a plurality of chassis holes configured to be penetrated by the plurality of bar fixers,
   wherein the rear surface of the bottom chassis contacts the fixing body located on the rear side with respect to the plurality of chassis holes, and
   wherein a front surface of the bottom chassis contacts each of the plurality of board bars located on a front side of the bottom chassis with respect to the plurality of chassis holes.

7. The display apparatus of claim 6, wherein the bottom chassis further comprises a plurality of mounting portions, the plurality of bar fixers being mounted to the plurality of mounting portions, and
   wherein each of the plurality of mounting portions extends from a side of an edge of each of the plurality of the chassis holes toward an inside of each of the plurality of chassis holes.

8. The display apparatus of claim 6, wherein each of the plurality of bar fixers further comprises an extending portion extending from the fixing body toward the plurality of board bars and is configured to penetrate the plurality of chassis holes.

9. The display apparatus of claim 8, wherein the bottom chassis comprises a plurality of mounting portions on which each of the plurality of bar fixers are mounted, and
   wherein each of the plurality of fixing bodies and each of the plurality of extending portions surrounds at least a portion of each of the plurality of mounting portions.

10. The display apparatus of claim 5, wherein each of the plurality of fixing bodies comprises:
    a cover portion configured to cover the rear surface of the bottom chassis; and
    an interference protrusion protruding from the cover portion toward the rear surface of the bottom chassis and configured to interfere with the bottom chassis.

11. The display apparatus of claim 5, wherein the bottom chassis further comprises a plurality of mounting portions, the plurality of bar fixers being mounted to the plurality of mounting portions, and
    wherein each of the plurality of coupling portions comprises a board hole formed at a position corresponding to a position of the plurality of mounting portions.

12. The display apparatus of claim 1, wherein the plurality of bar fixers are configured to be slidably mounted, in one direction, on the bottom chassis, and
wherein each of the plurality of bar fixers comprises:
a fixing body contacting a rear surface of the bottom chassis at a position mounted on the bottom chassis; and
an inclined guide extending in a direction that is away from the rear surface of the bottom chassis from the fixing body to the one direction.

13. The display apparatus of claim 1, further comprising:
a board body supported by the bottom chassis and connected to the plurality of board bars; and
a body fixer disposed on the board body and configured to fix the board body to the bottom chassis.

14. The display apparatus of claim 13, wherein the body fixer comprises a plurality of body fixers,
wherein a number of the plurality of body fixers is less than or equal to a number of the plurality of bar fixers.

15. A display apparatus comprising:
a display panel;
a plurality of light sources configured to emit light to the display panel;
a light source board on which the plurality of light sources are mounted;
a bottom chassis configured to support the light source board; and
a plurality of board fixers configured to fix the light source board to the bottom chassis;
wherein the light source board comprises:
a board body; and
a plurality of board bars spaced apart from each other along a first direction and extending from the board body, in a second direction different from the first direction,
wherein at least some of the plurality of board fixers are disposed at a center of each of the plurality of board bars in the first direction and parallel to a light source of the plurality of light sources mounted on each of the board bars in the first direction, and configured to fix the plurality of board bars to the bottom chassis,
wherein the plurality of light sources comprise:
a plurality of first side light sources disposed on one side of the first direction with respect to the central extending portion on each of the plurality of board bars; and
a plurality of second side light sources disposed on another side of the first direction with respect to the central extending portion on each of the plurality of board bars,
wherein each of the plurality of board bars comprises a power supply line configured to supply power to the plurality of light sources,
wherein the power supply line comprises:
a first power supply line arranged along a position in which the plurality of first side light sources are arranged; and
a second power supply line arranged along a position in which the plurality of second side light sources are arranged, and
wherein the coupling portion is disposed between the first power supply line and the second power supply line.

16. The display apparatus of claim 15, wherein each of the plurality of board fixers comprises:
an extending portion extending from a rear surface of the light source board facing the bottom chassis and configured to penetrate the bottom chassis; and
a fixing body connected to the extending portion and contacting a rear surface of the bottom chassis opposite to the light source board.

17. The display apparatus of claim 15, wherein the at least some of the plurality of board fixers are disposed adjacent to an end of a board bar of the plurality of board bars.

18. The display apparatus according to claim 17, wherein other board fixers of the plurality of board fixers, different from the at least some of the board fixers, are disposed on the board body and configured to fix the board body to the bottom chassis.

19. A display apparatus comprising:
a plurality of light sources;
a plurality of board bars arranged in a first direction and having at least some of the plurality of light sources mounted thereon;
a bottom chassis configured to support the plurality of board bars; and
a plurality of bar fixers configured to fix the plurality of board bars to the bottom chassis,
wherein each of the plurality of board bars comprises:
a central extending portion extending in a second direction perpendicular to the first direction;
a plurality of first protrusions protruding upward in the first direction from the central extending portion;
a plurality of second protrusions protruding downward in the first direction from the central extending portion; and
a power supply line configured to supply power to the plurality of light sources,
wherein each of the plurality of bar fixers are disposed at the central extending portion of each of the plurality of board bars and parallel with one of the plurality of first protrusions or the plurality of second protrusions with respect to the first direction
wherein the power supply line comprises:
a first power supply line arranged along a position in which the plurality of first protrusions are arranged; and
a second power supply line arranged along a position in which the plurality of second protrusions are arranged, and
wherein each of the plurality of bar fixers are disposed between the first power supply line and the second power supply line.

* * * * *